United States Patent [19]
Kobayashi et al.

[11] Patent Number: 5,716,481
[45] Date of Patent: Feb. 10, 1998

[54] MANUFACTURING METHOD AND MANUFACTURING APPARATUS FOR CERAMIC ELECTRONIC COMPONENTS

[75] Inventors: Ryo Kobayashi, Iwakimachi; Takaya Ishigaki, Honjo; Hiroshi Yagi; Shigehiko Shirai, both of Nikahomachi; Eizou Tsunoda, Komoro; Kaoru Kawasaki; Ryuji Hosogaya, both of Saku; Yasunori Chiba, Honjo; Yoshimi Yodokawa, Nikahomachi; Minoru Kanzaki, Kisakatamachi; Masatoshi Ito, Kisakatamachi; Takashi Abe, Kisakatamachi; Yasushi Izumibe, Nikahomachi, all of Japan

[73] Assignee: TDK Corporation, Tokyo, Japan

[21] Appl. No.: 549,220

[22] Filed: Oct. 27, 1995

[30] Foreign Application Priority Data

| Oct. 31, 1994 | [JP] | Japan | 6-267882 |
|---|---|---|---|
| Oct. 31, 1994 | [JP] | Japan | 6-267883 |
| Nov. 1, 1994 | [JP] | Japan | 6-269138 |
| Nov. 1, 1994 | [JP] | Japan | 6-296139 |
| Dec. 9, 1994 | [JP] | Japan | 6-306639 |
| Apr. 7, 1995 | [JP] | Japan | 7-082971 |
| Sep. 25, 1995 | [JP] | Japan | 7-246294 |
| Sep. 25, 1995 | [JP] | Japan | 7-246295 |

[51] Int. Cl.⁶ ............ B32B 31/12; B32B 31/30; B32B 35/00
[52] U.S. Cl. .......... 156/249; 156/64; 156/244.11; 156/244.16; 156/246; 156/277; 156/289; 101/415.1; 101/474; 101/DIG. 46; 425/113; 264/176.1; 427/58; 427/96
[58] Field of Search ............ 156/64, 277, 384, 156/387, 244.11, 244.16, 246, 247, 248, 249, 289, 378, 379, 182; 29/846, 851; 264/61, 64, 176.1, 638, 639; 427/96, 123, 58; 425/113, 516, DIG. 243; 101/474, 415.1, DIG. 46

[56] References Cited

U.S. PATENT DOCUMENTS

| 2,966,719 | 1/1961 | Park, Jr. | 264/63 |
|---|---|---|---|
| 3,617,326 | 11/1971 | Zuber . | |
| 4,109,377 | 8/1978 | Blazick et al. | 264/61 X |
| 4,698,192 | 10/1987 | Kuze et al. | 264/60 X |
| 4,782,751 | 11/1988 | Colapinto . | |
| 5,015,314 | 5/1991 | Suzuki et al. | 156/89 |
| 5,316,602 | 5/1994 | Kogame et al. | 156/64 |
| 5,417,784 | 5/1995 | Kobayashi et al. | 156/64 |
| 5,480,503 | 1/1996 | Casey et al. | 156/89 |
| 5,505,809 | 4/1996 | Yamamoto et al. | 156/89 X |

FOREIGN PATENT DOCUMENTS

| 0 709 866 | 5/1996 | European Pat. Off. . |
|---|---|---|
| 53-68853 | 6/1978 | Japan . |
| 63-188926 | 8/1988 | Japan . |
| 4-349967 | 12/1992 | Japan . |
| 5-101971 | 4/1993 | Japan . |
| 6-342736 | 12/1994 | Japan . |
| 92/13435 | 8/1992 | WIPO . |

OTHER PUBLICATIONS

Richerson, D.W., Modern Ceramic Engineering, pp. 471–477, 1992.

*Primary Examiner*—Curtis Mayes
*Attorney, Agent, or Firm*—Oblon, Spivak, McClelland, Maier & Neustadt, P.C.

[57] ABSTRACT

According to the present invention, ceramic electronic components are produced by a process which includes the steps of forming an unbaked ceramic layer on a surface of an organic flexible supporting body by applying a ceramic paste, the surface having an area that is given a peeling treatment and areas that are not given the peeling treatment; forming first target marks on the flexible supporting body; and positioning and priming electrodes on the unbaked ceramic layer, based upon information obtained through image processing of the first target marks.

32 Claims, 25 Drawing Sheets

MANUFACTURING METHOD AND MANUFACTURING APPARATUS FOR CERAMIC ELECTRONIC COMPONENTS

BACKGROUND OF THE INVENTION

1. Field of the Invention

The present invention relates to a manufacturing method and a manufacturing apparatus for ceramic electronic components.

2. Discussion of Background

One of the methods in the known art through which ceramic electronic components such as capacitors, piezo-electric elements, PTC thermistors, NTC thermistors and varistors are manufactured involves first applying a ceramic coating, which is a mixture of ceramic particles, organic binder, plasticizer, solvent and the like, on to a flexible supporting body through the doctor blade method, to form an unbaked ceramic layer called a green sheet, and then forming electrodes constituted with palladium, silver, nickel or the like, on top of it through screen printing. In order to achieve a laminated structure, green sheets thus obtained are laminated together for the desired number of lamination layers and then pressed and cut into unbaked ceramic elements. Ceramic electronic components are manufactured by first burning out the binder in the unbaked ceramic element thus obtained by baking them at 1000° to 1400° C. and then by forming terminal electrodes constituted with silver, silver-palladium, nickel, copper or the like on the baked bodies thus obtained.

When the manufacturing method described above is employed to manufacture, for instance, a laminated ceramic capacitor, one might consider, as a means for achieving miniaturization and greater capacitance, reducing the thickness of each ceramic layer, which is constituted of a dielectric body, and increasing the number of laminated layers. However, it is difficult to peel the unbaked ceramic layers from the flexible supporting body in order to laminate them. Especially, if the unbaked ceramic layers are thin, the unbaked ceramic layers cannot be peeled from the flexible supporting body successfully and this greatly reduces the yield. In addition, since the thin unbaked ceramic layers must be handled, defects such as an electrode shorting often occur in the resulting product.

As a means for solving these problems, Japanese Unexamined Patent Publication (KOKAI) No. 188926/1988 discloses a method whereby unbaked ceramic layers are thermally transferred with the flexible supporting body placed on top. However, in the case of the thermal transfer method, the positioning alignment for the upper electrode positioned on one surface of the unbaked ceramic layer and the lower electrode positioned on the other surface is poor. Furthermore, since it is necessary to perform thermal transfer every time a layer is laminated, the efficiency of production is reduced.

Moreover, as unbaked ceramic layers become thinner and the number of laminated layers increases, the quantity of flexible supporting bodies required to produce a ceramic electronic component also increases, leading to an increase in production cost.

In order to solve the problems described earlier, Japanese Unexamined Patent Publication (KOKAI) No. 342736/1994 discloses a method through which the process for forming a dielectric ceramic layer and the process for printing electrodes on the dielectric ceramic layer are repeated on the flexible supporting body for the number of times that corresponds to the required number of laminated layers to obtain a laminated body. However, this prior art publication does not disclose an effective means for preventing positional misalignment of the electrode patterns on the laminated body.

SUMMARY OF THE INVENTION

It is an object of the present invention to provide a manufacturing method and a manufacturing apparatus for ceramic electronic components with a high degree of precision and reliability through which the difficulty in peeling and the rate of property defects are greatly reduced even with thin unbaked ceramic layers.

It is another object of the present invention to provide a manufacturing method and a manufacturing apparatus for ceramic electronic components which require a minimum quantity of the flexible supporting bodies and which also offer good mass production.

It is yet another object of the present invention to provide a manufacturing method and a manufacturing apparatus for ceramic electronic components which can minimize positional misalignment of electrode patterns.

In order to achieve the objects described above, the manufacturing method for ceramic electronic components according to the present invention comprises an unbaked ceramic layer formation process, a first target mark formation process and a printing process. In the unbaked ceramic layer formation process, an unbaked ceramic layer (hereafter referred to as a green sheet) is formed on to an organic flexible supporting body by applying a ceramic coating. In the first target mark formation process, first target marks are formed on to the flexible supporting body. In the printing process, based upon the information obtained through image processing of the first target mark, positioning for electrode printing is performed and electrodes are printed on the green sheet.

According to the present invention, ceramic electronic components are produced by a process which includes the steps of:

forming an unbaked ceramic layer on a surface of an organic flexible supporting body by applying a ceramic paste, the surface having an area that is given a peeling treatment and areas that are not given the peeling treatment;

forming first target marks on the flexible supporting body; and positioning and printing electrodes on the unbaked ceramic layer, based upon information obtained through image processing of the first target marks.

The present invention is also achieved by using an apparatus for manufacturing ceramic electronic components, which includes:

means for forming an unbaked ceramic layer on an organic flexible supporting body by applying a ceramic paste, means for forming first target marks on the flexible supporting body, and means for positioning and printing electrodes on the unbaked ceramic layer, based upon information obtained through image processing of the first target marks, wherein;

the means for printing includes:

a printing table having a printing receptacle surface constituting a vacuum holding surface for receiving the flexible supporting body, and a table drive device which drives the printing table in the X-direction and the Y-direction, which two directions constitute two hypothetical orthogonal axes X and Y along said printing receptacle surface and in a Θ-direction, which direction rotates around an axis that runs orthogonally to the two axes.

The process of the present invention is also achieved by using an apparatus for manufacturing ceramic electronic components, which includes:

an applicator head and a plurality of rollers for forming an unbaked ceramic layer on an organic flexible supporting body by applying a ceramic paste;

means for forming first target marks on the flexible supporting body; and means for positioning and printing electrodes on the unbaked ceramic layer, based upon information obtained through image processing of the first target marks; wherein;

the applicator head is an extrusion type head provided with a plurality of nozzles and applies ceramic paste on one surface of the flexible supporting body, which runs in one direction, and each of the rollers is positioned to come in contact with only the surface of the flexible supporting body that is opposite the surface of the flexible supporting body upon which the ceramic paste is applied.

According to the present invention, since the method includes the green sheet formation process in which a green sheet is formed by applying a ceramic coating on to the flexible supporting body, and the printing process in which electrodes are printed on the green sheet, an improvement in mass productivity is achieved.

In addition, since, after forming first target marks for image processing on to the flexible supporting body, positioning for electrode printing is performed based upon the information obtained through the image processing of the first target marks. In this way, electrodes are formed with a high degree of precision at specific positions using the first target marks as a reference. Consequently, even complex electrode lamination structures are formed quickly and with great precision.

When laminated layers are required, as in the case of laminated ceramic capacitors, the method may employ a process in which, after performing the green sheet formation process and the printing process for the required number of times, the green sheets are peeled from the flexible supporting body and then a plurality of ceramic green sheets thus peeled are laminated together. In this case, since the green sheets are handled in a thick laminated band, it is not necessary to peel a single green sheet layer individually from the flexible supporting body or to handle them in single layers. In this case, the thermal transfer process is not required. Thus, a laminated ceramic electronic component is easily manufactured with a high degree of precision and reliability. Moreover, while green sheets are formed and electrodes are printed in alternating repetition, the height differences between the surfaces of the electrodes and the surface area of the flexible supporting body where the electrodes are not provided are absorbed. This results in elimination of defects such as cracks caused by the presence of the height differences. Moreover, since, through the process described earlier, a laminated band in which a plurality of layers of green sheets are integrated along with the electrodes is obtained, the problem of delamination after pressing, which presents itself in the prior art, is solved.

When it is necessary to perform lamination, the printing process may include a procedure in which second target marks are printed on the green sheet. Then, based upon the information obtained through the image processing of the second target marks, lamination of the ceramic green sheet provided with electrodes is performed. A plurality of green sheets lamination bands are thus positioned with a high degree of precision, ensuring that their electrodes have a specific positional relationship with the second target marks as reference. Moreover, when the engraving is replaced at the end of its service life, by checking the positional relationship that the first target marks have relative to the second target marks which are formed along with the electrodes, the positions of the first target marks relative to the electrodes can be discerned to facilitate image processing.

BRIEF DESCRIPTION OF THE DRAWINGS

These and other advantages, features and objects of the present invention will be understood by those of ordinary skill in the art referring to the annexed drawings, given purely by way of non-limitative examples, in which.

DETAILED DESCRIPTION OF THE PREFERRED EMBODIMENTS

Figure 1:
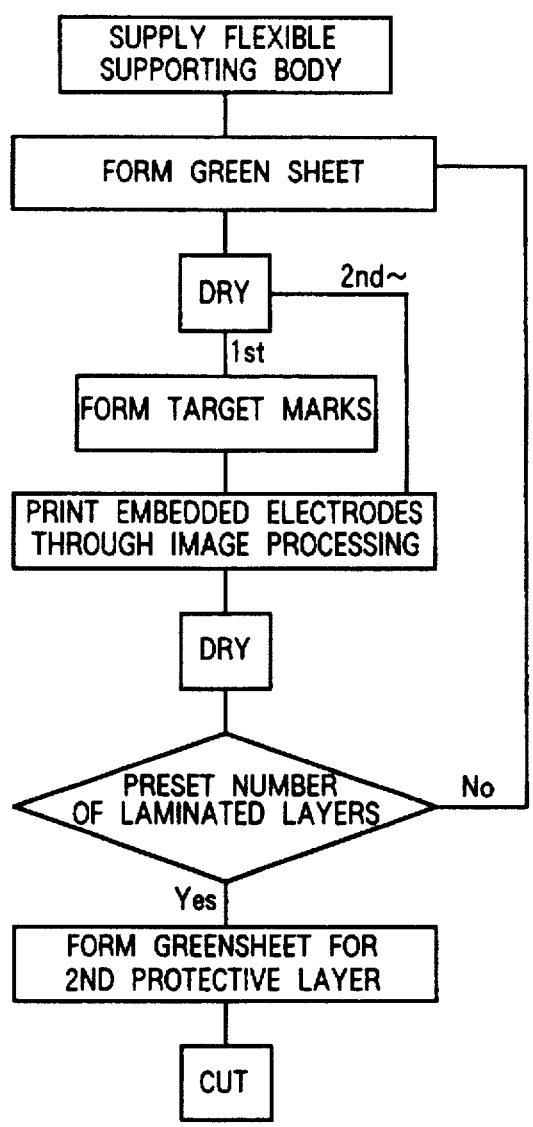
FIG. 1 is a flow chart illustrating the manufacturing method for ceramic electronic components according to the present invention.

The present invention may be widely applied in manufacturing ceramic electronic components such as ceramic capacitors, piezoelectric elements, PTC thermistors, NTC thermistors and varistors. As can be seen in the manufacturing flow chart in FIG. 1, ceramic particles are made into a coating material and the ceramic paste thus prepared is applied on to a flexible supporting body to form a green sheet.

The main constituent of the ceramic paste is ceramic particles of at least one type selected from the following; dielectric ceramic material, piezoelectric ceramic material, ceramic material with positive characteristics, ceramic material with negative characteristics, and non-linear voltage ceramic material.

The ceramic paste preferably contains at least one type of surfactant selected from phosphoric ester type surfactant or sulfonic acid type surfactant at a ratio of 0.05 wt % to 5 wt % relative to the ceramic particles.

Since, while preparing the ceramic paste, at least one type of surfactant selected from phosphoric ester type surfactant or sulfonic acid type surfactant is included at the ratio of 0.05 wt % to 5 wt % relative to the ceramic particles which are the main constituent of the ceramic paste, formation of pinholes is completely prevented from occurring in the applied green sheet when the green sheet is formed through the wet-on-dry method. As a result, shorting defects are almost completely prevented. If the content of the surfactant exceeds 5 wt %, drying of the green sheet becomes extremely poor and the green sheet ends up being transferred on to the flexible supporting body or the like, reducing the yield. If the surfactant is added at a ratio lower than 0.05 wt %, there will be almost no effect at all.

When the green sheet formation process is a process in which a green sheet is formed by using an extrusion type applicator head, it is desirable that the ceramic paste contains ceramic particles at 5 vol % to 20 vol %. Ceramic coating thus prepared has a viscosity much lower than that of the ceramic coating used in the prior art. Since the drying shrinkage factor of ceramic coating with low viscosity is large, the supply quantity is increased in order to achieve consistent thickness after drying, and by allowing a large gap between the tip of the applicator head and the flexible supporting body, formation of streaking caused by the applicator head is avoided.

For churning the ceramic particles into the coating, methylene chloride, ethyl acetate, acetone, methyl-ethyl ketone or the like is used for the solvent. The types of binders that can dissolve in organic solvent being used can generally be used as a binder for ceramic paste. For instance, acrylic, polyvinyl butyryl, ethyl cellulose or the like may be used as a binder.

Next, after drying the green sheet, electrodes are printed on the green sheet. In the electrode printing process, electrodes are printed through image processing. Before the printing process or during the first printing process, the first target marks for image processing are formed on to the flexible supporting body. In the printing process, positioning for electrode printing is performed based upon information obtained through image processing of the first target marks. With this, electrodes are formed with a high degree of precision at specific positions relative to the first target marks which are used as reference. Consequently, even a complex electrode lamination structure can be formed quickly and with precision. When electrode printing is completed, the green sheet is sent on to the drying process.

Of the processes described above, the processes starting from the green sheet formation process through the electrode printing process with image processing, to the drying process, are repeated on the flexible supporting body until the number of laminated layers that has been set in advance is achieved. When the preset number of laminated layers is achieved, a green sheet that is to function as a protective layer is formed over the electrodes on the uppermost layer and the green sheet that supports them. Then, the laminated body constituted with the electrodes and green sheets is cut and the laminated ceramic capacitor is taken out, which then goes through further required processes, such as baking and adding terminal electrodes, until a finished laminated ceramic capacitor is obtained.

Since the manufacturing method illustrated in FIG. 1 includes the green sheet formation process, in which a green sheet is formed by applying a ceramic coating on to a flexible supporting body and the printing process, in which electrodes are printed on the green sheet, an improvement in mass productivity is achieved.

Also, it is not necessary to peel individual green sheets from the flexible supporting body or to handle them as a single layer. In this case, the thermal transfer process is not required either. Thus, a laminated ceramic electronic component may be easily manufactured with a high degree of precision and reliability. Moreover, while green sheets are formed and electrodes are printed in alternating repetition, the height differences between the surfaces of the electrodes and the surface area of the flexible supporting body where the electrodes are not provided are absorbed. This results in the elimination of defects such as cracks caused by the presence of the height differences. Moreover, since a laminated green chip in which a plurality of layers of green sheets with integrated electrodes is obtained, the problem of delamination after pressing, which presents itself in the prior art, is solved.

Figure 2:
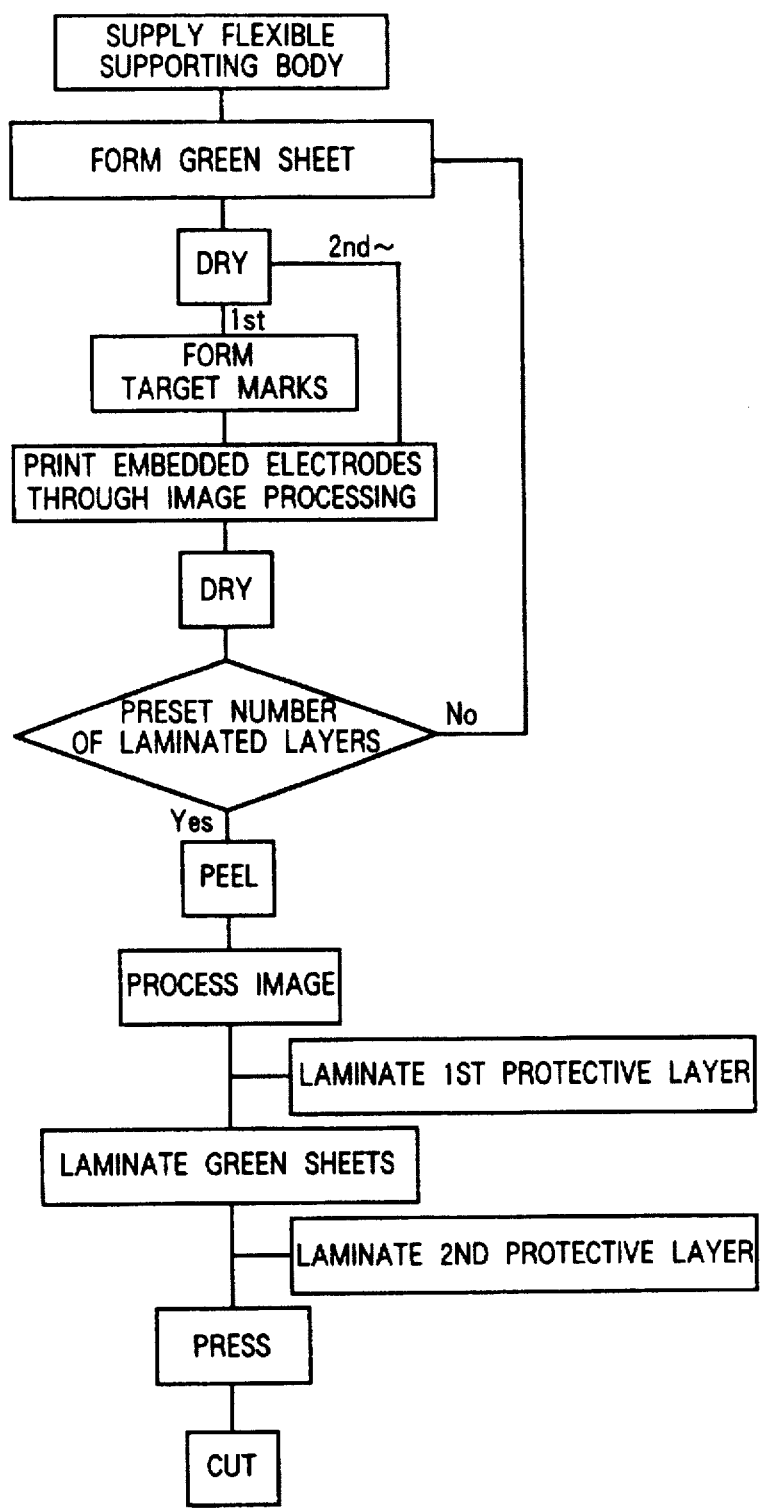
FIG. 2 is a flow chart illustrating another example of the manufacturing method for ceramic electronic components according to the present invention.

The difference between the manufacturing flow chart in FIG. 2 and the manufacturing flow chart shown in FIG. 1 is that, after the green sheet formation process and the printing process are performed for a plurality of times and the preset number of laminated layers is achieved, the laminated green sheets thus obtained are peeled from the flexible supporting body and then a plurality of laminated green sheets thus obtained by peeling are laminated. After lamination, they are pressed and then go through required processes such as the cutting process, the baking process, the process of adding terminal electrodes and the like, to achieve a finished laminated ceramic capacitor product.

When the manufacturing method illustrated in FIG. 2 is employed, the printing process includes a procedure in which second target marks are printed on the green sheet. Then, based upon the information obtained through image processing of the second target marks, lamination of the laminated green sheet is performed. With this, a plurality of laminated green sheet bands are positioned and laminated with a high degree of precision, ensuring that the electrodes have a specific positional relationship with the second target marks as reference. A protective layer is separately formed as a sheet and is laminated by a laminating machine.

Figure 3:
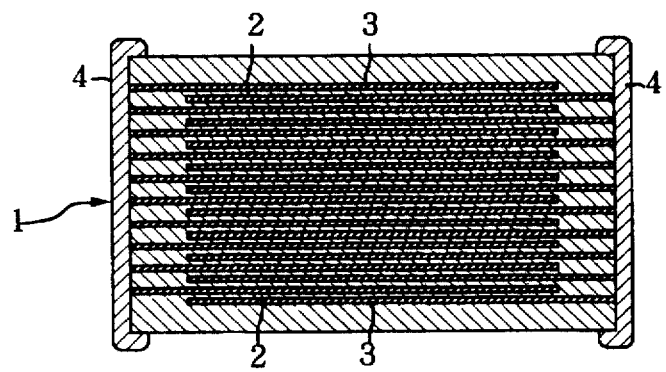
FIG. 3 is a cross section of a ceramic electronic component that is part of the product manufactured through the manufacturing method according to the present invention.

Next, each step shown in FIGS. 1 and 2 is explained in more detail using the manufacturing method for a laminated ceramic capacitor as an example. FIG. 3 shows a laminated ceramic capacitor manufactured through the manufacturing method according to the present invention. In the laminated ceramic capacitor 1, a number of electrodes 3 are embedded inside a dielectric layer 2. The electrodes 3 are alternately connected to either a terminal electrode 4 or a terminal electrode 4.

(Making the Dielectric Ceramic into a Coating)

After baking particles of barium titanate, chromium oxide, yttrium oxide, manganese carbonate, barium carbonate, calcium carbonate, silicon dioxide or the like with particle diameters of the particles at 0.1 μm to 1.0 μm, the baked particles are mixed in a ball mill for 24 hours to achieve a composition in which the converted $Cr_2O_3$ content is at 0.3 mol %, the converted MnO content is at 0.4%, the converted BaO content is at 2.4 mol %, the converted CaO content is at 1.6 mol %, the converted $SiO_2$ content is at 4 mol % and the converted $Y_2O_3$ content is at 0.1 mol % with $BaTiO_3$ at 100 mol %, and when it is dry, a dielectric material is obtained. 100 weight portions of the dielectric ceramic particles, 5 weight portions of acrylic resin, 40 weight portions of methylene chloride, 25 weight portions of acetone and 6 weight portions of mineral spirit are mixed. Then, at least one of either a phosphoric ester type surfactant or a sulfonic type surfactant is added at a ratio within the range of 0.05 wt % to 5 wt % relative to the dielectric ceramic particles. The mixture is then agitated in a pot frame using commercially available φ10 mm zirconium beads to obtain a dielectric ceramic coating.

(Green Sheet Formation Process)

Figure 4:
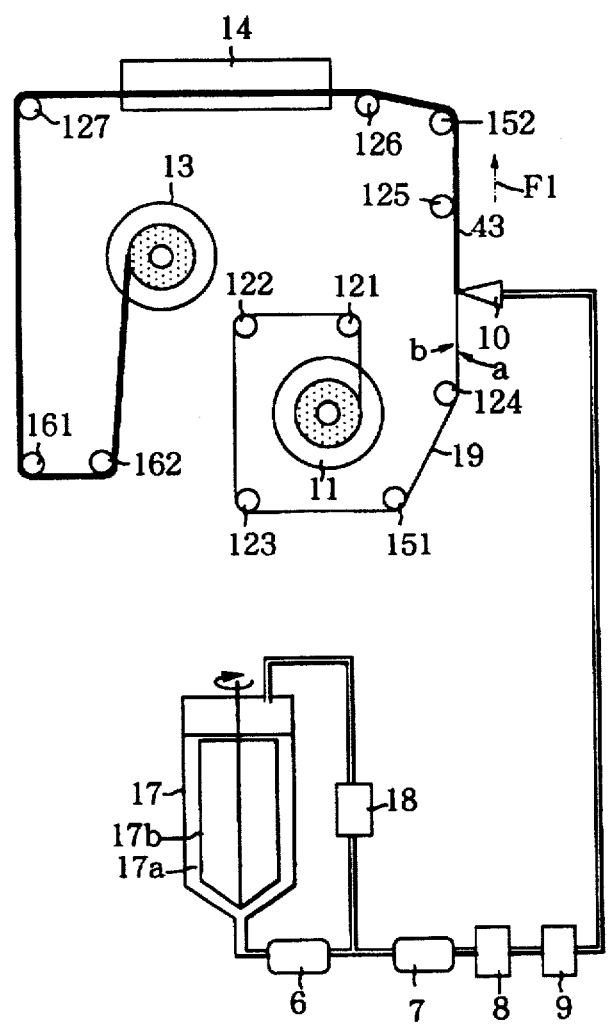
FIG. 4 illustrates the green sheet formation process included in the manufacturing method for ceramic electronic components according to the present invention.

The dielectric ceramic coating thus obtained is applied on to the flexible supporting body, which is supplied continuously, to form green sheets. FIG. 4 illustrates the green sheet formation process. In the present invention, the green sheet formation process is carried out using an extrusion type applicator head.

As a means for forming green sheets, the most common method employed in the prior art is the doctor blade method, disclosed in Japanese Unexamined Patent Publication (KOKAI) No. 188926/1988. The doctor blade method is an effective means when the allowable green sheet thickness is large. However, if green sheets with a dry thickness of 10 μm or less are required, the following problems arise.

First, since, in the doctor blade method, ceramic coating is applied on to a supporting body by gravity feed, when a ceramic coating with low viscosity and high fluidity is used, the ceramic coating is dispersed too freely on the supporting body, making it impossible to obtain green sheets of a specific thickness. The viscosity of the ceramic coating is determined mainly with the volumetric ratio of the ceramic particles and the viscosity is reduced as the volumetric ratio of the ceramic particles is reduced. With the doctor blade method, in order to ensure a specific viscosity and fluidity, it is necessary to maintain the volumetric ratio of the ceramic particles at a value exceeding 20%. Because of this, the fluidity of the ceramic coating cannot be lowered to the point where it is below the value determined in correspondence to the volumetric ratio.

The drying shrinkage factor of the ceramic coating is reduced as the viscosity increases and, as a result, the higher the viscosity, the thinner the coating application required for achieving consistent dry thickness. With the doctor blade method, which necessitates maintaining the volumetric ratio of the ceramic particles at a value exceeding 20%, the gap between the tip of the blade and the supporting body must be set at a value corresponding to the viscosity determined by the volumetric ratio or at a value smaller than that. Because of this, a number of streaks are formed in the green sheets.

In addition, since the gap between the tip of the blade and the supporting body must be kept small and the thickness of the ceramic coating layer must also be kept small, pinholes tend to form. Pinholes are also formed when the ceramic coating layer applied on to the supporting body is sloughed off the surface of the flexible supporting body. The sloughing off the ceramic coating layer from the flexible supporting body tends to occur more often when the ceramic coating layer is thin.

Moreover, because of its basic operational characteristics, in the doctor blade method, the ceramic coating leaks from both sides of the blade in the direction of the width, and scraps of the material adhere on both ends in the direction of the width of the green sheet. These sheet scraps adhere to the screen engraving during electrode paste printing, resulting in reduced life of the engraving or causing pinholes when they enter between laminated layers. Since pinholes cause shorting defects and voltage withstand defects in the laminated ceramic capacitor, taking effective measures against them is crucial.

The green sheet formation process which employs an extrusion type applicator head solves the problems presented by the green sheet formation process employing the doctor blade method described above.

In FIG. 4, an applicator head 10 applies a ceramic paste 17a on surface a of a flexible supporting body 19, which runs in one direction F1 through extrusion. The flexible supporting body 19 may be constituted with transparent, translucent or opaque plastic film. Reference number 11 indicates a delivery reel while, reference numbers 121 to 127 indicate guide rollers, reference numbers 161 and 162 indicate snaking correcting rollers, reference number 14 indicates a drying furnace and reference number 13 indicates a take-up reel.

The rollers 121 to 127, 151, 152, 161 and 162 are all provided in such a manner that they are in contact only with the surface (b) of the flexible supporting body 19, which is on the opposite side from the surface on to which the ceramic paste 17a is applied. In order to ensure that the surface of the green sheet is even, the tension is controlled between the suction rollers 151 and 152, thus controlling the chasing measurement and the nozzle angle of the applicator head 10.

In a ceramic coating applicator device of the prior art, some of the rollers 121 to 127, 151, 152, 161 and 162 are usually in contact with the surface on which the ceramic paste 17a is applied. In this embodiment, all of the rollers 121 to 127, 151, 152, 161 and 162 are positioned in such a manner that they are in contact only with surface (b) of the flexible supporting body 19, opposite the surface on which the ceramic paste 17a is applied. With this structure, the rollers 121 to 127, 151, 152, 161 and 162 do not come in contact with the green sheet 43, which has been formed by coating, and formation of pinholes in the green sheet 43 due to scratches and the like is prevented.

Since the applicator head 10 applies the ceramic paste 17a by extrusion, it is a basic characteristic of this type of application that the ceramic paste 17a does not leak from either side of the head in the direction of its width. Because of this, unlike in the doctor blade method, this method does not create sheet scraps which will adhere to both ends in the direction of the width of the green sheet 43. Consequently, no sheet scraps adhere to the screen engraving during electrode paste printing, thereby increasing the life of the engraving and also preventing formation of pinholes caused by such sheet scraps. Thus, a laminated ceramic electronic component with an extremely low shorting defect rate and very low voltage withstanding defect rate is achieved.

The ceramic coating applicator device shown in FIG. 4 further includes a quantitative decision pump 6 and a mass flowmeter 9. The quantitative decision pump 6 and the mass flow meter 9 control the quantity of the coating material 17a supplied to the extrusion type applicator head 10. Reference number 7 indicates a high precision quantitative decision gear pump and reference number 8 indicates a filter. The quantitative decision gear pump 7 is provided to improve the quantitative precision of the quantitative decision pump 6 and the filter 8 is mounted to remove any foreign matter at the last stage. Because of this, the quantity of the coating material 17a discharged from the extrusion type applicator head 10 is stabilized, and an even green sheet 43 with high surface precision and reduced inconsistency in thickness is achieved. Reference number 17b indicates an agitator.

Figure 5:
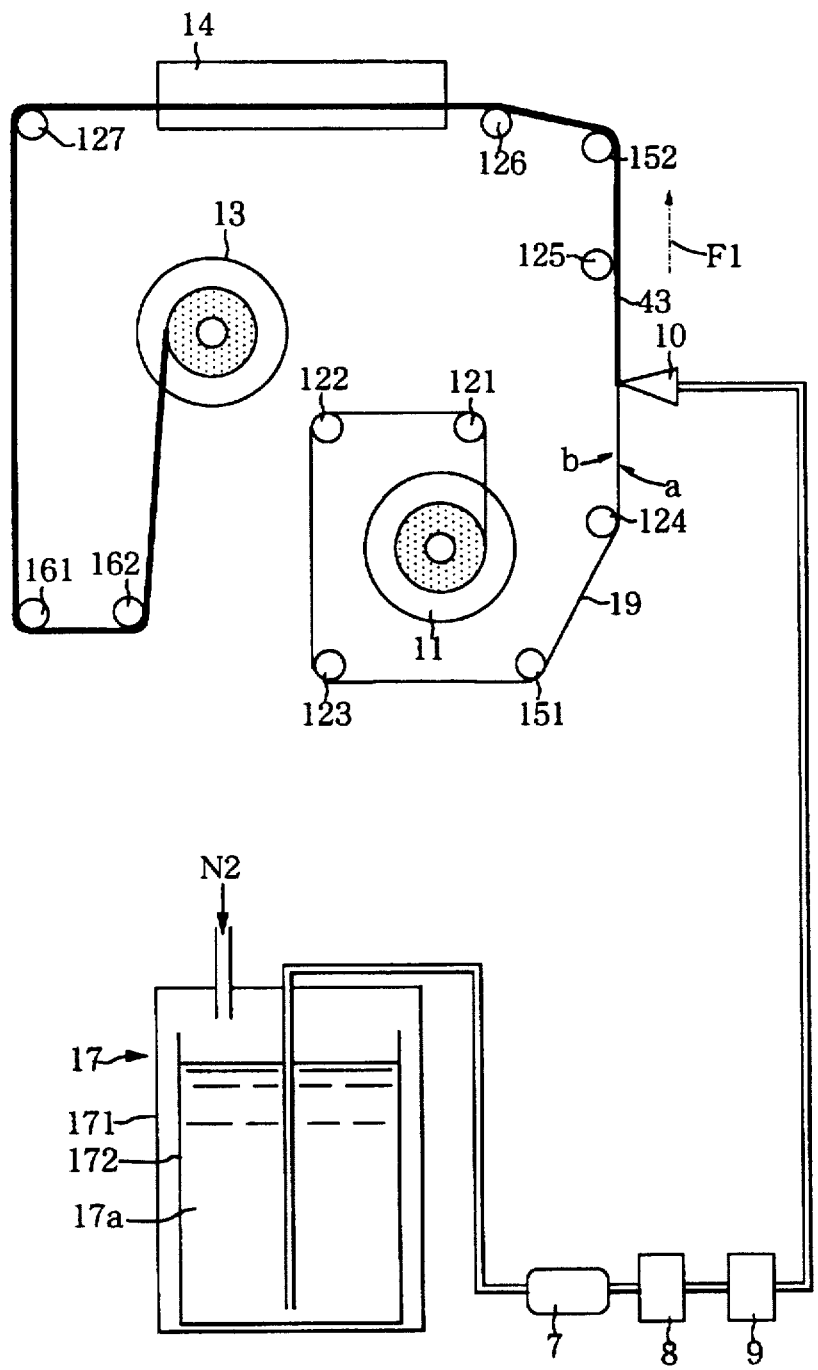
FIG. 5 illustrates another example of the green sheet formation process included in the manufacturing method for ceramic electronic components according to the present invention.

FIG. 5 shows another embodiment of the ceramic coating applicator device according to the present invention. In the figure, the same reference numbers are assigned to components that are identical to those in FIG. 4 and their explanation is omitted here. The tank 17 includes an outer tank 171 and an inner tank 172, and with an inert gas or nitrogen gas $N_2$ supplied to the outer tank 171 under pressure, an extruding force is applied to the ceramic paste 17a in the inner tank 172.

Figure 6:
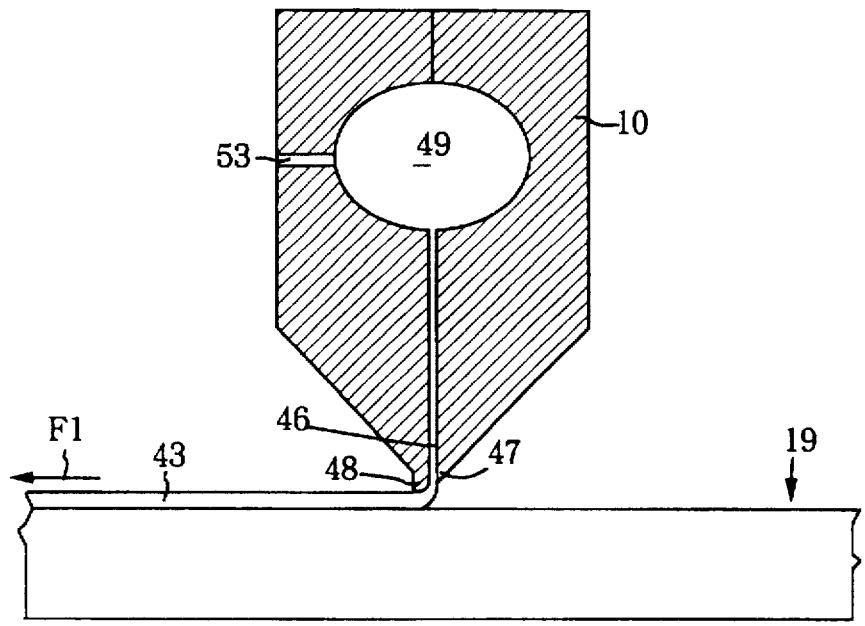
FIG. 6 is a cross section of the extrusion type applicator head used in the process illustrated in FIG. 4 or FIG. 5.

FIG. 6 illustrates the state in which the green sheet 43 is formed using the applicator head 10. Reference number 46 indicates a channel for discharging the ceramic paste, reference number 47 indicates the upstream side of the nozzle, and reference number 48 indicates the downstream side of the nozzle. Reference number 49 indicates a ceramic paste reservoir and reference number 53 indicates a supply port through which the ceramic paste is supplied to the ceramic paste reservoir. In FIG. 6, reference code F1 indicates the direction in which the flexible supporting body 19 travels.

Figure 7:
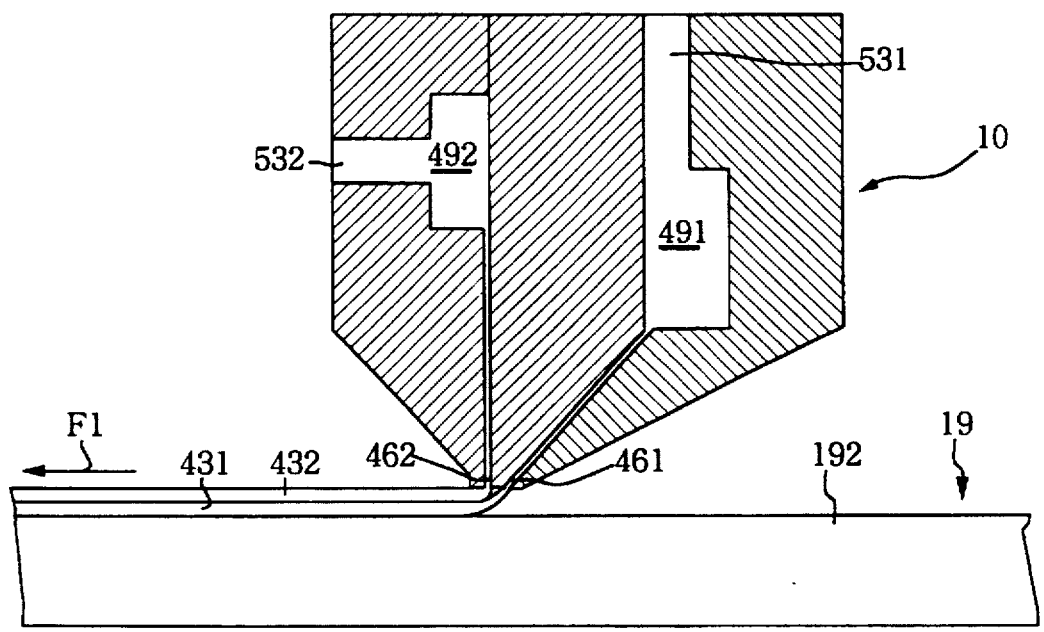
FIG. 7 is a cross section of another example of the extrusion type applicator head used in the process illustrated in FIG. 4 or FIG. 5.

FIG. 7 illustrates the state in which a green sheet is formed using another extrusion type applicator head. The extrusion type applicator head in this figure is provided with a plurality of nozzle channels 461 and 462. Reference numbers 491 and 492 indicate ceramic paste reservoirs while reference numbers 531 and 532 indicate supply ports through which ceramic paste is supplied to the ceramic paste reservoirs 491 and 492. When this extrusion type applicator head 10 is used, as shown in FIG. 7, after the ceramic paste 17a, which has been stored in the ceramic coating reservoir 491, is applied on to the flexible supporting body 19 through the channel 461, another ceramic coating layer 432 is overlaid on to the applied ceramic coating layer 431 through the channel 462. With this, the formation of pinholes is inhibited.

Apart from succeeding in forming an even green sheet with no streaking, as explained above, the extrusion type applicator head 10 provides the advantage that it is extremely effective when another green sheet is formed over a green sheet 43 that has already been formed. In the doctor blade method, the blade is constantly in contact with the flexible supporting body 19 and, although this does not present any problems when forming a first green sheet, when forming the second and subsequent green sheets, the blade invariably comes in contact with the dried surface of the first green sheet 43. This presents a problem in that the first green sheet 43 is abraded, particularly toward the edges. Also, as the number of laminated layers increases, the total thickness increases too, and the lamination comes in contact with the upstream side of the blade and may be sloughed off.

However, with the extrusion type applicator head 10, when the next green sheet 43 is formed over the surface of the green sheet 43 that has already been formed, the extrusion type applicator head 10 does not come in contact with the surface of the green sheet 43 that has already been formed, and thus, a good green sheet 43 with no abrasions is obtained.

The ceramic paste 17a that is used in combination with the extrusion type applicator head 10 contains ceramic particles at 5 vol % to 20 vol %. The ceramic paste 17a thus prepared, has a viscosity much lower than that of the ceramic coating used in the prior art. Since the drying shrinkage factor of the ceramic paste 17a with low viscosity is large, the supply quantity is increased in order to achieve consistent thickness after drying, and by allowing a large gap between the tip of the applicator head 10 and the flexible supporting body 19, formation of streaking caused by the applicator head 10 is avoided.

In addition, since a large gap is present between the tip of the applicator head 10 and the flexible supporting body 19 and thus the thickness of the coating is also large, formation of pinholes is reliably inhibited. Apart from being formed by streaks, pinholes are also formed if the ceramic coating layer applied on to the supporting body 19 sloughs off from the surface of the flexible supporting body 19. Sloughing of the ceramic coating layer from the flexible supporting body 19 tends to occur more often if the ceramic coating layer is thin. According to the present invention, as explained earlier, the thickness of the application of the ceramic paste 17a may be large and consequently, sloughing of the ceramic coating layer does not occur easily, making it less likely that pinholes will be formed.

While in this embodiment, the ceramic paste is constituted of dielectric ceramic particles, ceramic pastes that may be used in combination with the extrusion type applicator head 10 are not limited to those with dielectric ceramic particles. Aside from dielectric ceramic particles, various types of ceramic particles including piezoelectric, varistor and thermistor ceramic particles may be used, as mentioned earlier.

Figure 8:
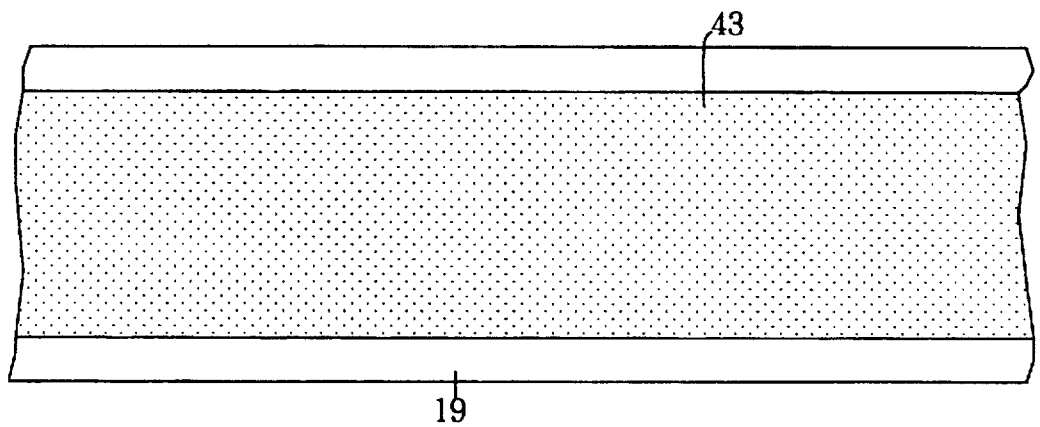
FIG. 8 is a plan view of the flexible supporting body obtained through the process illustrated in FIG. 4 or FIG. 5.

FIG. 8 is a plan view of the flexible supporting body 19 with the green sheet 43 that has been applied on to it in the manner described above.

(Peeling Process)

As has already been explained in reference to FIGS. 1 and 2, the manufacturing method according to the present invention requires a process in which the formed green sheet is peeled from the flexible supporting body. In the prior art, there is a difficulty in peeling a green sheet from the flexible supporting body without damaging it during the peeling process. This difficulty results in frequent characteristics defects in the finished product, such as shorting, which reduce the yield in lamination. This problem becomes even more pronounced with thin green sheets. For instance, in the case of a laminated ceramic capacitor, as a means for achieving miniaturization and greater capacitance, it is necessary to reduce the thickness of each dielectric layer and increase the number of laminated layers. When the thickness is small and the number of layers is large, since thin green sheets cannot be peeled from the flexible supporting body successfully, the yield of lamination becomes very poor. In addition, since thin green sheets must be handled, the finished product tends to have characteristics defects such as shorting.

In order to facilitate the peeling process, one might consider performing a peeling treatment over the entire surface of the flexible supporting body on to which the ceramic paste is applied. However, if the peelability is too high, the green sheets may peel away from the flexible supporting body with a very slight force exerted from the outside, or small pieces of the sheet may break off and be introduced on to the lamination surface interface, causing a structural defect.

Next, a flexible supporting body which can provide an appropriate degree of peelability and adhesiveness to the green sheet and with which it is possible to greatly reduce the difficulty in peeling as well as the likelihood of characteristics defects in the product even when the green sheets are thin, is described.

Figure 9:
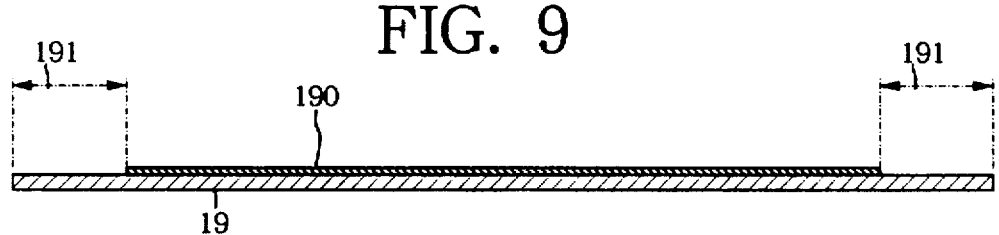
FIG. 9 is a cross section of the flexible supporting body used in the process illustrated in FIG. 4 or FIG. 5.

FIG. 9 is a lateral cross section of a flexible supporting body that has been given a peeling treatment. The surface of the flexible supporting body 19 on to which the ceramic coating is applied, has an area 190 that has been given the peeling treatment and an area 191 that has not been given the treatment. The peeling treatment may be performed by thinly coating a peeling film 190, constituted of, for instance, Si on one surface of the flexible supporting body 19.

As mentioned above, since the surface of the flexible supporting body 19 on to which the ceramic coating is applied, has the area 190 with the peeling treatment, the green sheet formed on the flexible supporting body 19 is easily peeled from the flexible supporting body 19.

Furthermore, since the surface of the flexible supporting body 19 on to which the ceramic coating is applied, also has the area 191 that has not been given the peeling treatment, as well as the area that has been given the treatment, the adhesion of the green sheet to the flexible supporting body 19 is increased. Because of this, the green sheet does not slough off from the flexible supporting body 19 during printing to become adhered to the engraving and neither do broken pieces of green sheet become introduced on to the lamination interface as foreign matter to cause structural defects. In addition, the means for ceramic coating application such as the nozzle or the blade, which may come into contact with the green sheet does not cause the green sheet to slough off from the flexible supporting body 19.

If the peeling film 190 is provided over the entire surface of the flexible supporting body 19, the edges of the green sheet may become sloughed off from the flexible supporting body 19 to become adhered to the engraving or broken off edges may be introduced into the lamination interface as foreign matter to cause structural defects. In addition, the means for ceramic coating application, such as the nozzle or the doctor blade, which may come into contact with the green sheet even slightly, will sometimes cause the green sheet to slough off from the flexible supporting body 19.

If the peeling film 190 is formed in such a manner that there is the area 191 on the flexible supporting body 19 that is not treated for peeling, the adhesion of the edges of the green sheet to the flexible supporting body 19 improves, and the problems discussed above are avoided. This point is to be explained in further detail later.

Since, in the embodiment shown in FIG. 9, there are two areas 191 that are not peeling treated, one provided at either side of the flexible supporting body 19 in the direction of the width, the adhesion of the edges of the green sheet to the flexible supporting body 19 is improved, further enhancing the effect described above. The width of the areas 191 which are not peeling treated is approximately 0.5 to 20 mm under normal manufacturing conditions.

Figure 10:
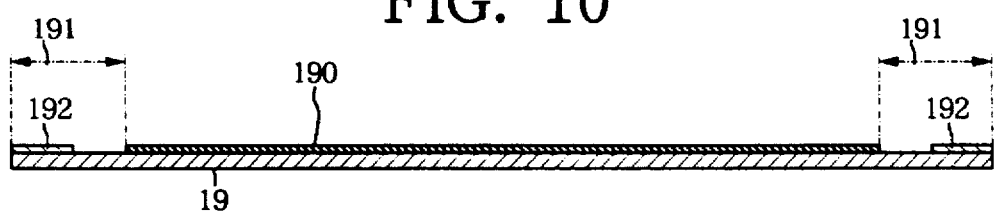
FIG. 10 is a cross section of another example of the flexible supporting body used in the process illustrated in FIG. 4 or FIG. 5.

FIG. 10 is a cross section of another embodiment of the flexible supporting body according to the present invention. In this embodiment, the areas 191 that are not peeling treated are each provided on either side of the flexible supporting body 19 in the direction of its width, and those areas 191 that are not peeling treated each include a mark formation area 192. The mark formation areas 192 are colored. The mark formation areas 192 are formed by applying coating or the like in a color that provides a contrast with the color of the flexible supporting body 19 in narrow strips along the direction of the length of the flexible supporting body 19. The role of these mark formation areas 192 is to facilitate accurate detection of the target marks and the pitch marks during image processing, which is to be explained later.

Figure 11:
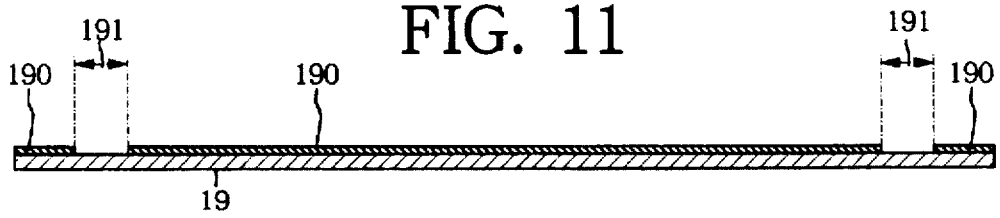
FIG. 11 is a cross section of yet another example of the flexible supporting body used in the process illustrated in FIG. 4 or FIG. 5.

FIG. 11 is a lateral cross section of another embodiment of the flexible supporting body 19 according to the present invention. In this embodiment, the areas 191 that are not peeling treated are provided on either side of the flexible supporting body 19 in the direction of its width, and the areas 190, which have been peeling treated, are provided on the outside of the untreated areas 191.

Figure 12:
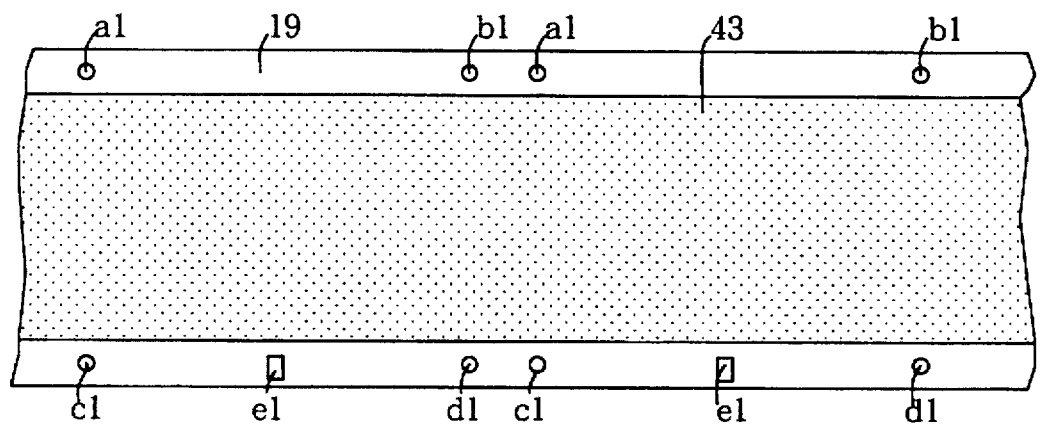
FIG. 12 is a plan view of the flexible supporting body obtained through the first target mark formation process.
Figure 13:
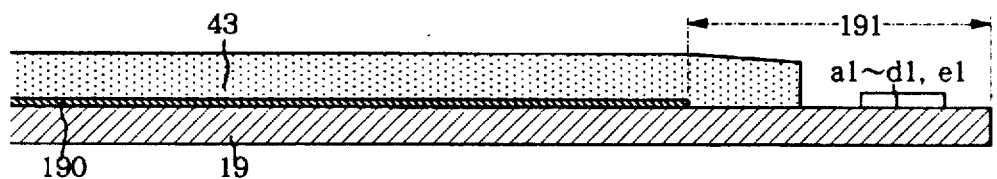
FIG. 13 is an enlarged partial cross section of a green sheet formed using the flexible supporting body shown in FIG. 9.
Figure 14:
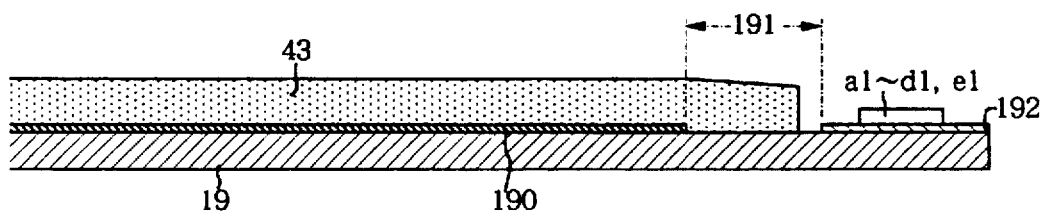
FIG. 14 is an enlarged partial cross section of a green sheet formed using the flexible supporting body shown in FIG. 10.

FIG. 12 is a plan view of the flexible supporting body on which the green sheet 43 is formed. FIG. 13 is a cross section of a green sheet 43 formed using the flexible supporting body shown in FIG. 9. FIG. 14 is a cross section of a green sheet formed using the flexible supporting body shown in FIG. 10. As shown in FIGS. 9 to 11, the flexible supporting body 19 has areas 190 that are peeling treated and areas 191 that are not peeling treated on its surface, on to which the ceramic coating is applied. By performing such peeling treatment, after the laminating process to achieve the required number of laminated layers is completed, the lowermost green sheet 43 formed on the flexible supporting body 19 is easily peeled from the flexible supporting body 19.

As shown in FIG. 9, the peeling film 190 is formed in such a manner that the areas 191 that are not peeling treated are formed on both sides of the flexible supporting body 19 in the direction or its width instead of over the enter surface of the flexible supporting body 19.

The advantages of the flexible supporting body 19 shown in FIG. 13 have already been explained in reference to FIGS. 9 to 11. That is, if the peeling film 190 is provided over the entire surface of the flexible supporting body 19, the following problems may arise during the embedded electrode printing process, which is to be explained below, i.e., the edges of the green sheet 43 may lift off from the flexible supporting body 19 and become adhered to the engraving or broken off edges may be introduced into the lamination interface as foreign matter during lamination to cause structural defects. In addition, if the nozzle 10 comes in contact with the green sheet even slightly, it may cause the green sheet 43 to peel off from the flexible supporting body 19.

In contrast, if the peeling film 190 is formed in such a manner that there are areas 191 that are not peeling treated present on both sides of the flexible supporting body 19 in the direction of its width, as shown in FIG. 13, the edge adhesion of the green sheet 43 relative to the flexible supporting body 19 increases, thereby avoiding the problems described above. The width of the areas 191 that are not peeling treated should be within the range of 0.5 to 20 mm under normal manufacturing conditions and these areas should be sufficiently small relative to the area 190 which is peeling treated.

In FIG. 14, mark formation areas 192 are formed inside the areas 191 that are not peeling treated and are provided on both sides of the flexible supporting body 19 in the direction of its width. The green sheet 43 is applied in such a manner that its edges in the direction of the width are positioned between the peeling film 190 and the mark formation areas 192. The green sheet 43 may also be applied in such a manner that the edges in the direction of its width overlap the mark formation area 192 within a range that ensures that the green sheet 43 will not interfere with image processing.

After the green sheet 43 is formed, the flexible supporting body 19 is dried in a drying furnace 14 and is then taken up on to the take-up reel 13 (see FIG. 4 or FIG. 5).

(First target mark formation process)

Next, prior to electrode printing, first target marks (a1), (b1), (e1), and (d1) and a pitch mark (e1), for image processing, are formed on the flexible supporting body 19, which is provided with the green sheet 43. FIG. 12 which was mentioned earlier, is a plan view of the flexible supporting body 19 on which the first target marks (a1) to (d1) and the pitch mark (e1) have been formed.

The first target marks (a1), (b1), (e1), and (d1) are used as targets for positioning the printing positions of electrodes, based upon the information obtained through image processing, during the process, in which electrode printing is performed. As a result, in order to minimize the positioning misalignment of the electrode patterns in image processing that employs cameras, it is crucial that the color of the first target marks (a1), (b1), (e1), and (d1) and the color of the flexible supporting body 19 are a combination that provide good optical contrast.

The colored area in the flexible supporting body 19 may be formed by coloring the flexible supporting body itself. However, normally, the flexible supporting body will be constituted using a commercially available transparent polyethylene terephthalate film or the like. Consequently, it is desirable to form a colored area on the flexible supporting body by applying colored paste on one surface of the flexible supporting body or by bonding a colored film to it.

Figure 15:
FIG. 15 is a cross section of a flexible supporting body which is suitable for the first target mark formation process.

FIG. 15 is a cross section of the flexible supporting body 19 provided with a colored area. The flexible supporting body 19 is provided with a colored layer 192 which constitutes a colored area (mark formation area) on the surface of the base body, which is constituted with polyethylene terephthalate or the like. The colored layer 192 may be formed by bonding a colored film or by applying a pigmented coating. The colored layer 192 is provided over the entire surface of the flexible supporting body 19.

Figure 16:
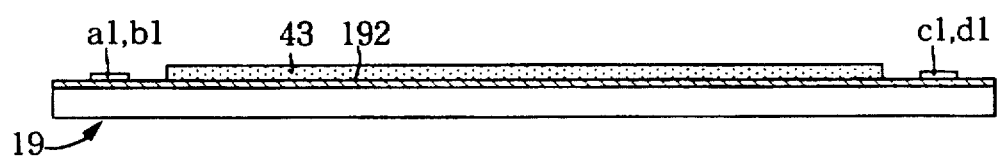
FIG. 16 is a cross section of a green sheet with the first target marks formed using the flexible supporting body shown in FIG. 15.

FIG. 16 is a cross section of a green sheet 43 formed on the flexible supporting body 19 shown in FIG. 15. In the figure, the first target marks (a1) to (d1) and the pitch mark (e1) are formed at the ends of the flexible supporting body 19 in the direction of its width on the surface where the colored layer 192 and the green sheet 43 are provided and in the areas where the green sheet 43 is not present. The first target marks (a1) to (d1) and the pitch mark (e1) are formed by screen printing, gravure printing, ink jet printing or the like and can be used for image processing.

There is no restriction as to the timing with which the first target marks (a1) to (d1) and the pitch mark (e1) are formed, as long as they are formed before the electrode printing through image processing is performed. Therefore, they may be formed at the same time as the first electrodes. In this embodiment, the first target marks (a1) to (d1) and the pitch mark (e1) are formed after the green sheet 43 is formed.

Another good timing with which the first target marks (a1) to (d1) may be formed, is before cutting the original material for the flexible supporting body with a slitter. If the first target marks (a1) to (d1) are formed before the original material for the flexible supporting body is cut with the slitter, the original material may be cut to a specific width with the slitter using the first target marks (a1) to (d1) for reference. The first target marks (a1) to (d1) should be a color that makes a clear optical contrast to the flexible supporting body 19 and should also be formed circularly.

Color combinations that are optimal for achieving clear optical contrast between the colored layer 192 of the flexible supporting body 19 and the first target marks (a1), (b1), (c1), and (d1) for image processing, during the image processing employing a camera, may be achieved by selecting a yellow, a pink, a pale green or a white for the colored layer 192 of the flexible supporting body 19 and black for the first target marks (a1), (b1), (c1), and (d1).

Figure 17:
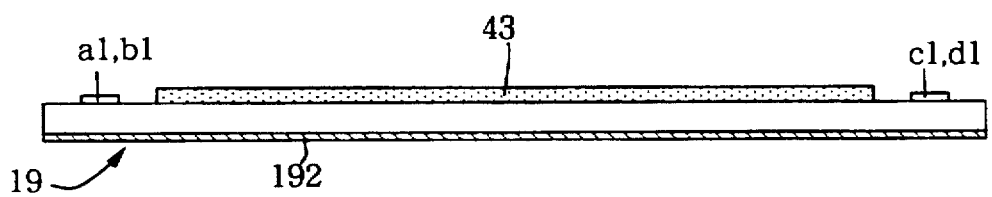
FIG. 17 is a cross section of a green sheet with the first target marks formed using another flexible supporting body.

FIG. 17 shows another example of formation of the first target marks (a1) to (d1) and the pitch mark (e1). The first target marks (a1) to (d1) and the pitch mark (e1) are formed at the ends of the flexible supporting body 19 in the direction of its width on the opposite surface from where the colored layer 192 is provided. The green sheet 43 is also formed on the opposite surface from where the colored layer 192 is present.

Figure 18:
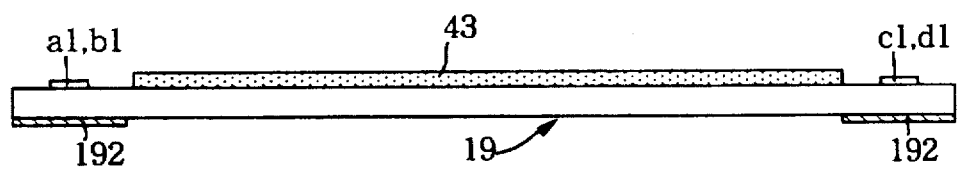
FIG. 18 is a cross section of a green sheet with the first target marks formed using yet another flexible supporting body.

FIG. 18 shows yet another example of formation of the first target marks (a1) to (d1) and the pitch mark (e1). The first target marks (a1) to (d1) and the pitch mark (e1) are formed at the ends of the flexible supporting body 19 in the direction of its width on the surface which is opposite from the surface where the colored layers 192 are formed. The green sheet 43 is also formed on the opposite side from the surface where the colored layers 192 are provided.

Figure 19:
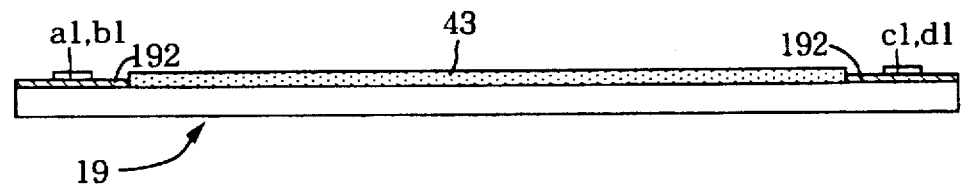
FIG. 19 is a cross section of a green sheet with the first target marks formed using yet another flexible supporting body.

FIG. 19 shows yet another example of formation of the first target marks (a1) to (d1) and the pitch mark (e1). The colored layers 192 are provided on the same surface where the green sheet 43 is formed, but separated from it by gaps and the first target marks (a1) to (d1) are provided on top of the colored layers 192.

Note that while the peeling treatment is not illustrated in FIGS. 15 to 19, it goes without saying that the peeling treatment may be performed in conformance to FIGS. 9 to 11. Since the peeling treatment must be performed on the surface that comes in contact with the green sheet 43, if the green sheet 43 comes in contact with the surface of the colored layer 192, the peeling treatment will be performed on the surface of the colored layer.

(Electrode printing through image processing)

Next, by using the take-up reel 13, on to which the flexible supporting body 19 has been taken up, electrodes are printed on the green sheet 43 on the flexible supporting body 19. In electrode printing, the printing positions of electrodes are first determined based upon the information obtained through the image processing of the first target marks (a1) to (d1).

Figure 20:
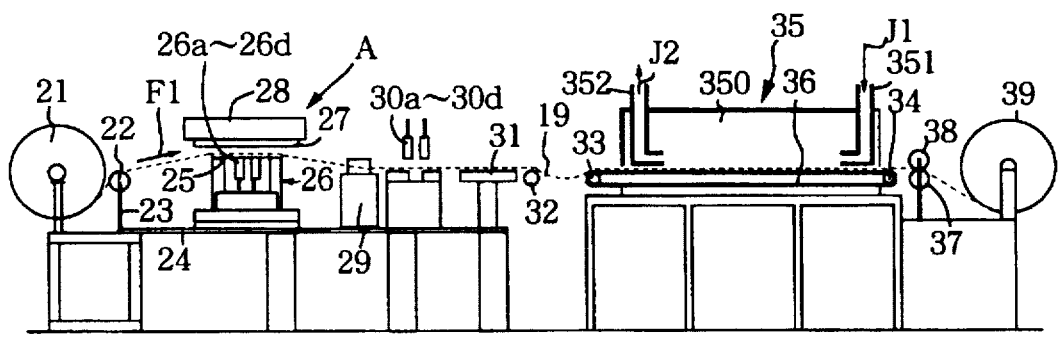
FIG. 20 shows an image processor/printer used in an embodiment of the manufacturing method for ceramic electronic components according to the present invention.

FIG. 20 is a schematic diagram of the structure of a ceramic electronic component manufacturing apparatus provided with an image processor/printer according to the present invention. In the ceramic electronic component manufacturing apparatus in the figure, the flexible supporting body 19, which is provided with a green sheet formed on one surface, is drawn out from a supply roll 21 in the direction indicated with the arrow F1, travels through a guide roller 22 and is then led to a printing table 25. Reference number 23 indicates a supporting member that supports the guide roller 22 while reference number 24 indicates a support platform. Reference number 27 indicates an engraving and reference number 28 indicates a supporting member for the engraving 27.

On the printing table 25, electrodes in a specific pattern are printed on the green sheet formed on one surface of the flexible supporting body 19 by a printer A. The electrode paste used for electrode printing contains metal particles which will constitute an electrically conductive component, a binder and a solvent. The metal particles that constitute the electrically conductive component are of the type known in the prior art and are normally prepared using at least one of the following: palladium, silver, nickel or an alloy formed by combining these. Such an electrode paste turns black when applied.

The flexible supporting body 19 on which the electrodes have been printed then goes through a light table 31 for visual inspection and a guide roller 32. The flexible supporting body 19 is then taken up by a conveyer belt 36, which runs a circuit between rollers 33 and 34. After it goes through the drying treatment in a dryer 35, it travels through a guide roller 37 and a cutter 38 before it is taken up by a take-up roller 39.

The printer A includes an image processing device 26. The image processing device 26 determines the printing positions of the electrodes on the flexible supporting body 19 through image processing of the first target marks (a1) to (d1) formed on the flexible supporting body 19. After the first target marks (a1) to (d1) are formed on the flexible supporting body 19, in order to print electrodes, the positioning for electrode printing is performed based upon the information obtained through the image processing of the first target marks (a1) to (d1). Because of this, electrodes are formed with a high degree of precision at specific positions using the first target marks (a1) to (d1) as a reference. Consequently, even complex electrode lamination structures may be formed quickly and with high precision.

Figure 21:
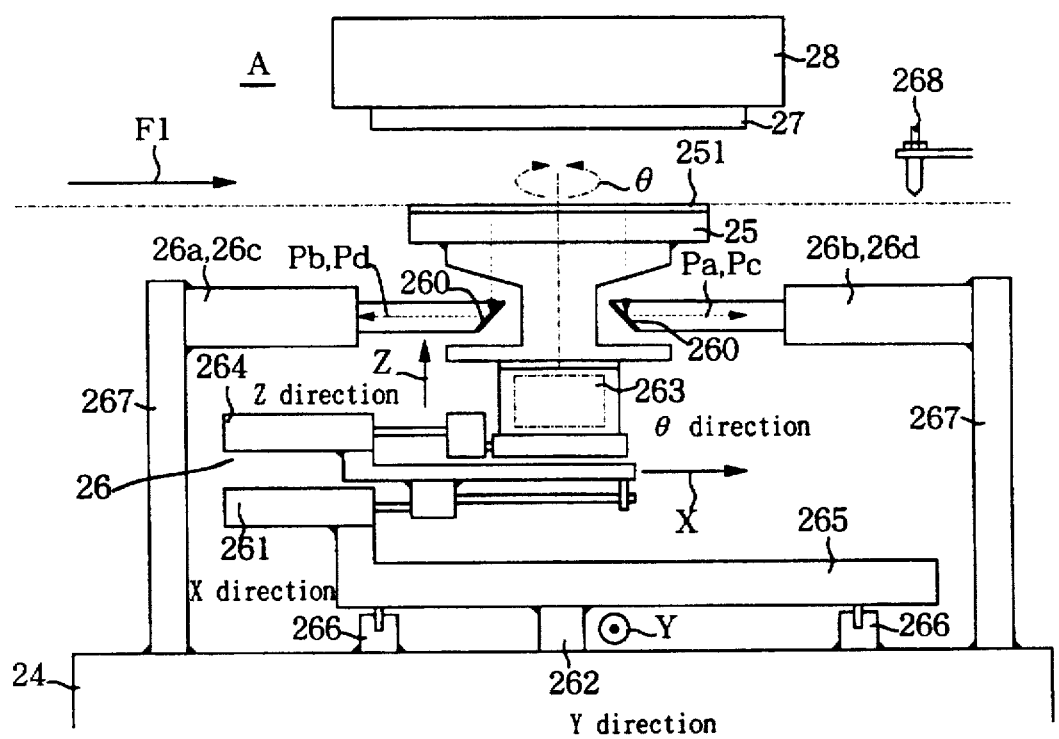
FIG. 21 schematically shows the structure of the image processing device included in the image processor/printer shown in FIG. 20.

In this embodiment, the printer A is provided with the printing table 25 and table drive devices 261 to 264, as shown in an enlargement in FIG. 21. The table 25 is provided with a printing receptacle surface 251 to receive the flexible supporting body 19, with this printing receptacle surface 251 constituting a vacuum suction surface. The table drive devices 261 to 264 drive the table 25. With this structure, when the printing positions are determined, the flexible supporting body 19 is reliably vacuum held so that no positional misalignment will occur relative to the printing receptacle surface 251 of the table 25. Then positioning is performed at a specific position on it. This improves the accuracy of positioning.

The table drive devices 261 to 263 are, more specifically, an X-direction drive device 261, a Y-direction drive device 262 and a θ-direction drive device 263 when an X-direction and a Y-direction, i.e., two orthogonal axes X and Y are hypothesized along the printing receptacle surface 251 and a θ-direction, which rotates around an axis that runs orthogonally to the two axes, is hypothesized. With these drive devices 261 to 263, the table 25 is driven in X-direction, Y-direction and θ-direction.

In this structure, positioning is performed by moving the flexible supporting body 19, which is vacuum held on the printing receptacle 251, in the X-direction, the Y-direction and the θ-direction. As a result, if a positional misalignment occurs in any of these directions, it can be reliably corrected. The table drive device 264 drives the table 25 in the direction of Z axis. The table drive devices 261 to 264 are supported by a guide rail 266 which is secured onto the support platform and a support member 265 which in turn is supported by the guide rail 266.

The image processing device 26 is provided with a plurality of cameras 26a to 26d with the light receiving portions of the cameras 26a to 26d provided on the table 25. This structure allows the positions of the cameras 26a to 26d to be fixed relative to the printing receptacle surface 251 and as a result, the first target marks (a1) to (d1) are accurately read with the cameras 26a to 26d at fixed positions at all times. This, in turn, improves the positioning accuracy.

In this embodiment, the cameras 26a to 26d are supported on the support platform 24 as shown in FIG. 21 and the first target marks (a1) to (d1) on the flexible supporting body 19 passing over the printing receptacle surface 251 are detected by the optical paths Pa to Pd leading from the light receiving portions that face the printing receptacle surface 251 of the table 25. The optical paths Pa to Pd include a reflective mirror 260 for transmitting light from the light receiving portions to the cameras 26a to 26d.

Figure 22:
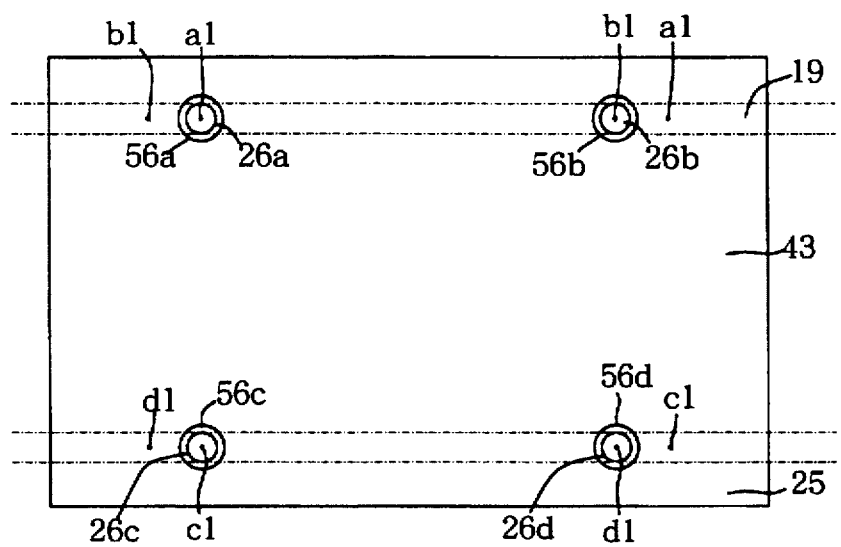
FIG. 22 shows the positions of the image processing cameras included in the image processing device shown in FIG. 20.
Figure 23:
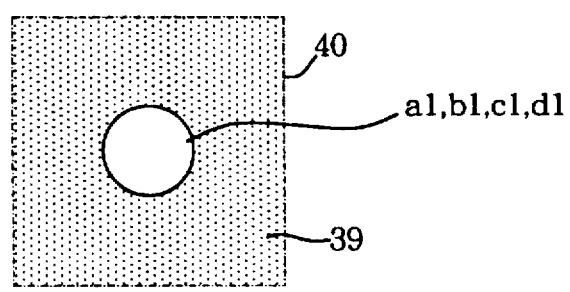
FIG. 23 shows the visual field of an image processing camera included in the image processing device shown in FIG. 20.

In addition, as shown in FIG. 22, the light receiving portions of the cameras 26a to 26d are embedded in the four corners of the table 25 via the holes 56a, 56b, 56c and 56d. The cameras 26a to 26d read the coordinates (x, y) of the first target marks (a1) to (d1) which enter a detection area 40. Based upon the data that have been read, data processing is performed on a computer system (not shown) and the table 25 is controlled to move a required distance in θ-direction, x-direction and y-direction.

Figure 24:
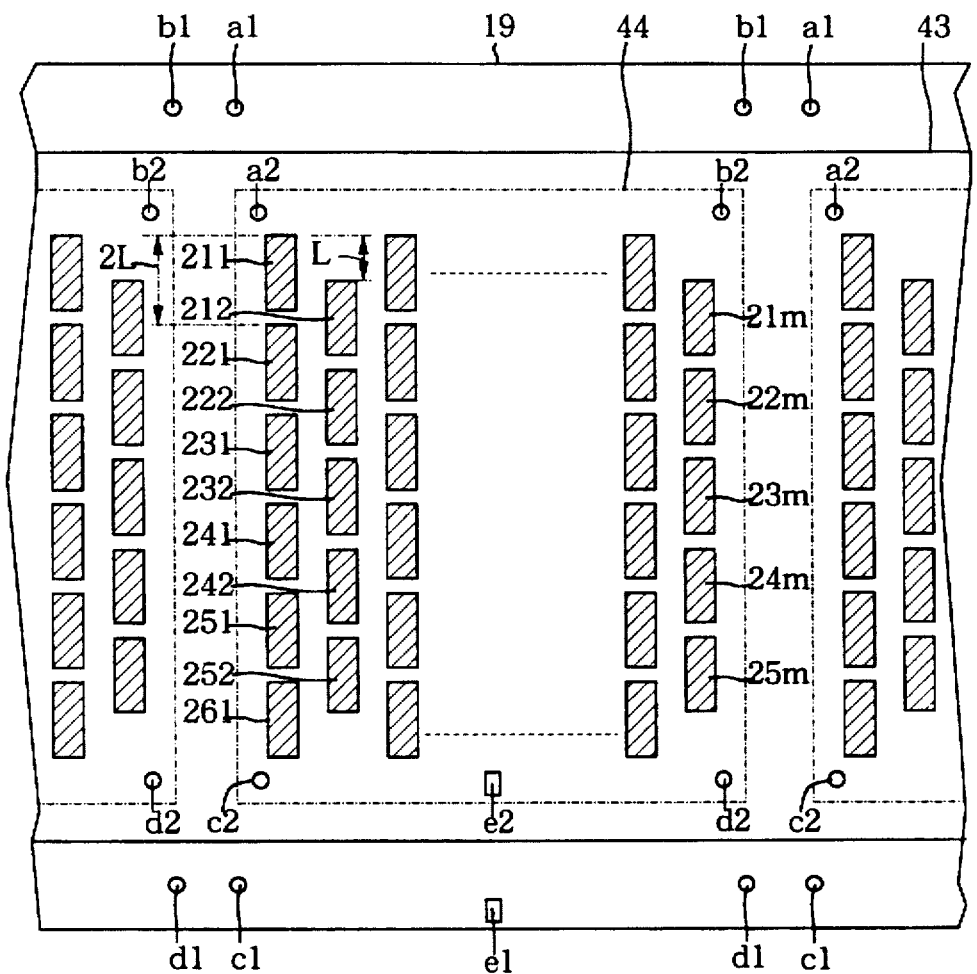
FIG. 24 is a plan view of a surface of the flexible supporting body obtained after the first printing of electrodes is performed by the image processor/printer shown in FIG. 20.
Figure 25:
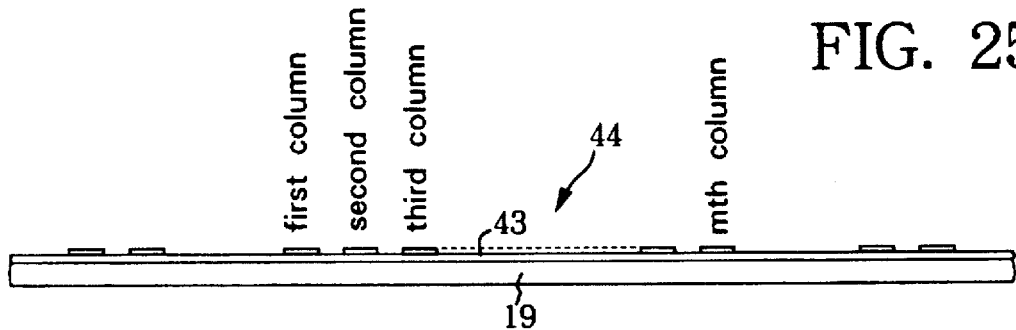
FIG. 25 is a side view of the flexible supporting body shown in FIG. 24.

FIG. 24 shows the electrode pattern 44 achieved in the electrode printing process described above and FIG. 25 is a side view of FIG. 24. Each electrode constituting the electrode pattern 44 is made of a appropriate electrode material having, for instance, nickel, copper or the like as its main constituent. The electrode pattern 44 is arrayed in columns with individual electrodes positioned over intervals in the lateral direction and the longitudinal direction. In this embodiment, the electrodes form (m) number of rows in the lateral direction and, in the longitudinal direction, 6 rows in the columns assigned odd numbers and 5 rows in the columns assigned even numbers. In each reference number assigned to an electrode, the first digit indicates the column that the electrode belongs to and the second digit indicates the row it belongs to. The numbers of the rows and the columns are arbitrary. The electrodes are arrayed in such a manner that in adjacent electrode columns in the lateral direction, for instance, in the first column constituted with the electrodes 211 to 261 and in the second column constituted with the electrodes 212 to 252, the individual corresponding electrodes (211 and 212) to (261 and 262) are offset by a specific measurement L in the longitudinal direction. The measurement L should be ½ of the pitch 2L between the electrodes. However, since the electrode pattern is moved by the table 25 to achieve a desired pattern, it is not restricted to the pattern shown in the figure. For instance, the pattern in which the electrodes in each column repeat an identical arrangement is acceptable.

In the printing process, second target marks (a2), (b2), (c2) and (d2) and a pitch mark (e2) are printed along with the electrode pattern 44. Printing the second target marks (a2), (b2), (c2) and (d2) and the pitch mark (e2) along with the electrode pattern 44 makes it possible to perform positioning and lamination with a high degree of precision so that, after executing the ceramic layer formation process and the printing process for a plurality of times, when the laminated ceramic layers thus obtained are peeled from the flexible supporting body and a plurality of such laminated ceramic layers that have been peeled from the flexible supporting body are laminated together, the individual electrode patterns 44 achieve a specific positional relationship among themselves with the second target marks (a2), (b2), (c2) and (d2) used as reference. In addition, when the engraving is replaced, by checking the positional relationship of the first target marks (a1), (b1), (e1), and (d1) to the second target marks (a2), (b2), (c2) and (d2) which are printed at the same time as the electrode pattern 44, the positions of the first target marks (a1), (b1), (e1), and (d1) relative to the electrode pattern 44 are ascertained to facilitate image processing.

Figure 26:
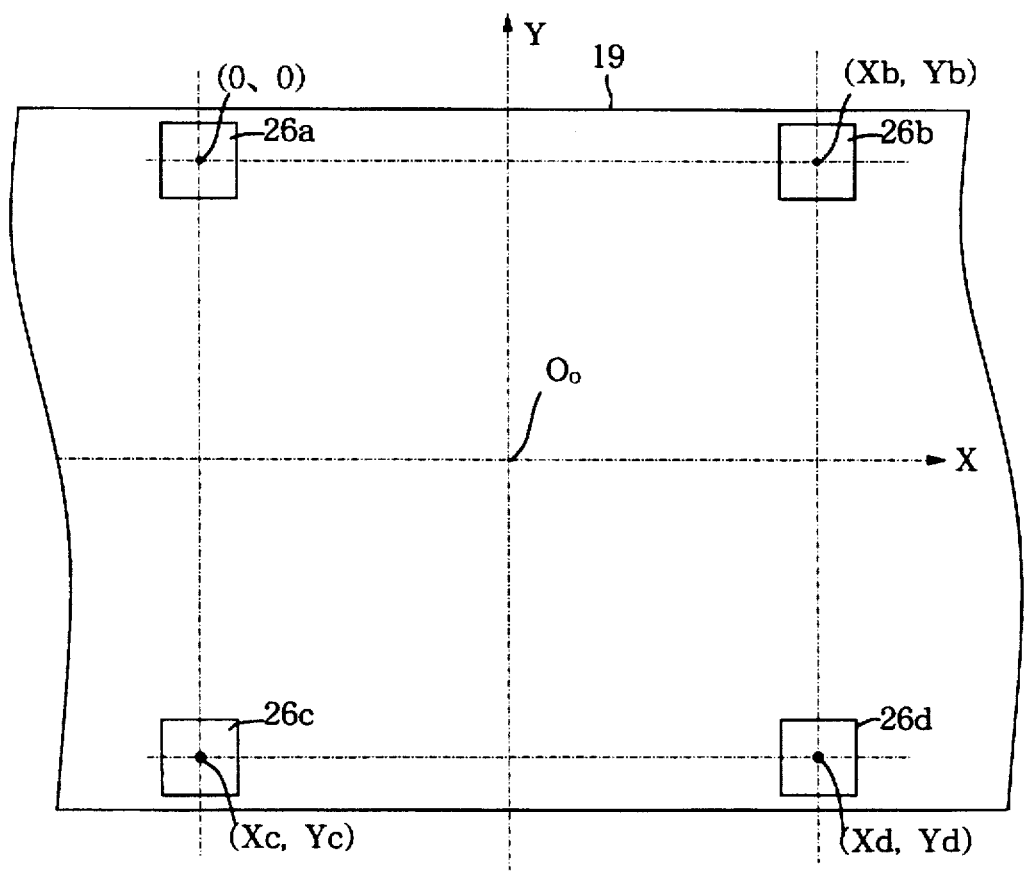
FIG. 26 illustrates positional alignment performed based upon the image information obtained by using the image processing cameras.

Now, details of positioning and positional alignment using the table 25 are explained. FIG. 26 shows the positional relationships that the four cameras 26a to 26d have to the table 25. The cameras 26a to 26d are positioned at four points that correspond to the positions of the first target marks (a1) to (d1) on the flexible supporting body 19 described earlier. While the positions at which the cameras 26a to 26d are mounted are determined in design, mounting errors and the like are bound to occur in practice, causing errors in reading the coordinates. As a means for correcting these errors, before activating the manufacturing processes according to the present invention, one of the cameras 26a to 26d positioned under the table 25, for instance the camera 26a, is selected for reference and its central point is set as the origin point (0, 0).

Next, the table 25 is moved in the direction of the X-axis and the coordinates (Xb, Yb) when the position that corresponds to the origin point (0, 0) reaches the central point of the camera 26b are read. By doing this, the position of the camera 26b when the central point of the camera 26a is set as the origin point (0, 0) is expressed as the coordinates (Xb, Yb). The identical procedure is performed for the other cameras 26c and 26d to determine the coordinates (Xc, Yc) and (Xd, Yd). This initial correction is performed in combination with the image processing on the display. Since the coordinates of the cameras 26a to 26d are determined in this manner by driving the high precision table 25, the errors in reading the coordinates become very small. Reference number $O_o$ indicates the mid-point calculated based upon the coordinates (0, 0) to (Xd, Yd) which are the positions of the cameras 26a to 26d respectively.

Figure 27:
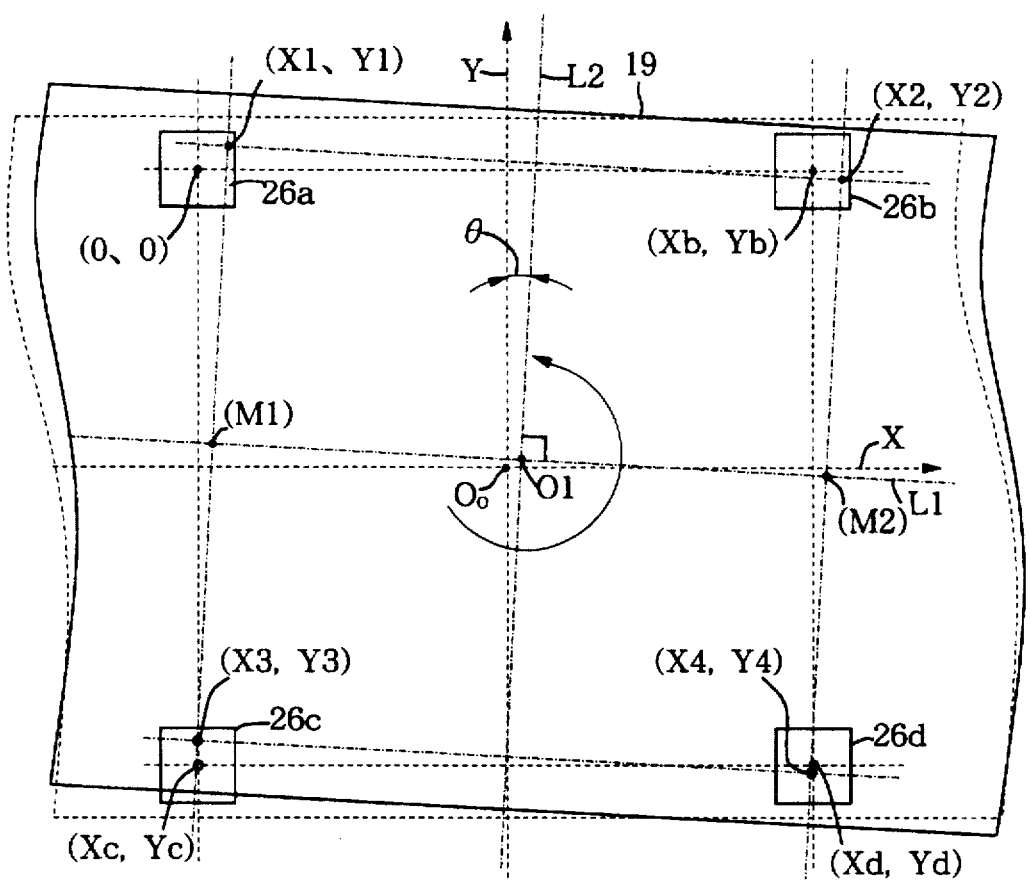
FIG. 27 illustrates the correction performed in the positional alignment based upon the image information obtained by using the image processing cameras.

Although it may be assumed that the printing positions of the first target marks (a1) to (d1) are hardly offset if at all, since the flexible supporting body 19 is being transported, it often rotates by an angle θ within the plane of the table 25 or becomes offset in the direction of the X-axis or the Y-axis. By correcting such positional misalignment, the electrode pattern 44 is printed with a high degree of precision. As a means for this correction, by using the cameras 26a to 26d for which the initial correction explained above has been completed, the coordinates of the first target marks (a1) to (d1) of the flexible supporting body 19, which is vacuum held to the table 25 are read as shown in FIG. 27. The values read by the cameras 26a to 26d are converted to coordinates that take into consideration the coordinates (Xb to Yb) to (Xd to Yd) set in the initial correction.

The coordinates of the first target mark (a1) obtained by the camera 26a in this manner, the coordinates of the first target mark (b1) obtained by the camera 26b, the coordinates of the first target mark (c1) obtained by the camera 26c and the coordinates of the first target mark (d1) obtained by the camera 26d are respectively expressed as (X1, Y1), (X2, Y2), (X3, Y3) and (X4, Y4).

Based upon the data on the coordinates (X1, Y1) to (X4, Y4) thus obtained, the dead mid-point O1 of the quadrangle which is enclosed by the first target marks (a1) to (d1) is determined as shown in FIG. 27. The dead mid-point O1 is determined as the mid point of the line L1 connecting the two mid-points (M1) and (M2) of the two sides that face opposite each other. This dead mid-point O1 functions as the origin point for positioning during printing. Then, a perpendicular L2, which passes through the dead mid-point O1 of the line L1 is determined. The perpendicular L2 normally has an angle θ relative to the Y-axis of the table 25. The calculation of the dead mid-point O1 and the angle θ is performed by a computer system (not shown) based upon the data input from the cameras 26a to 26d. Then, based upon a control signal sent from the computer system, the table 25 is driven to rotate in the direction indicated with the arrow so that θ=0. With this, the angle θ is corrected. The table 25 is further driven in the direction of the X-axis and in the direction of the Y-axis based upon the control signal from the computer system so that the positioning alignment in the directions of the X-axis and the Y-axis is performed before the positional alignment is completed.

Figure 28:
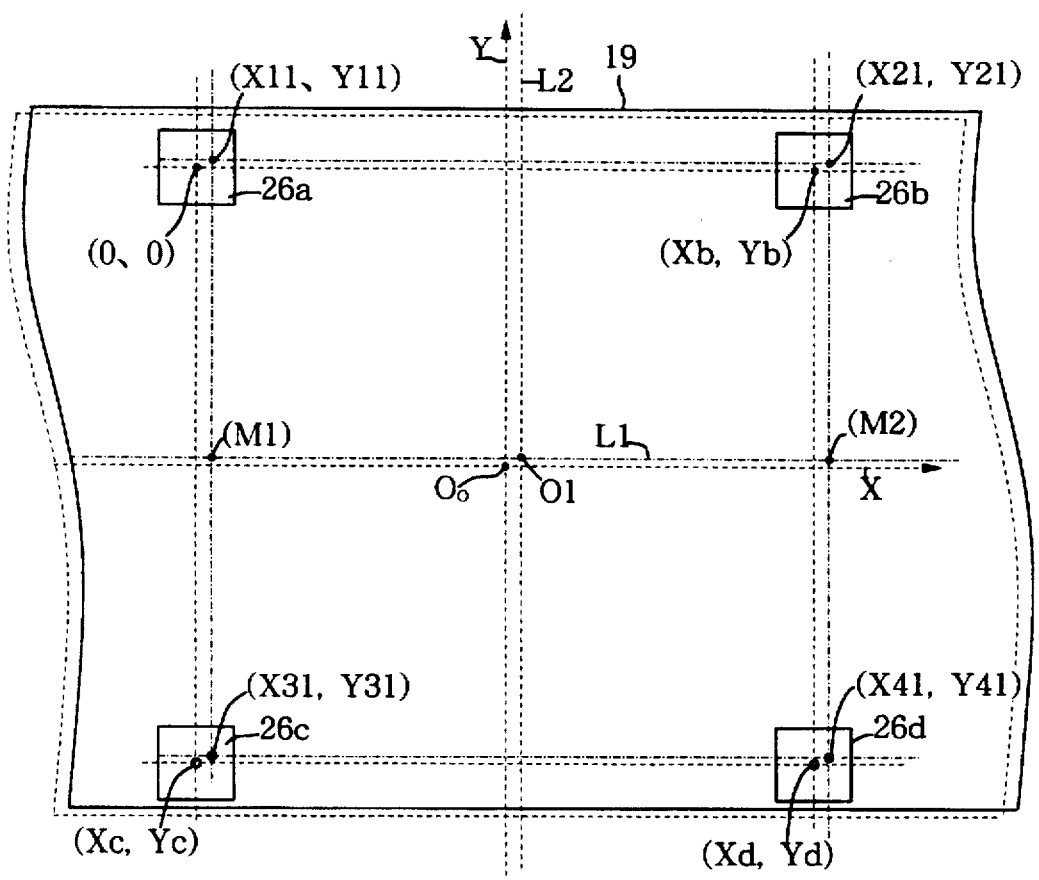
FIG. 28 illustrates the state after the correction is performed in the positional alignment based upon the image information obtained by using the image processing cameras.
Figure 29:
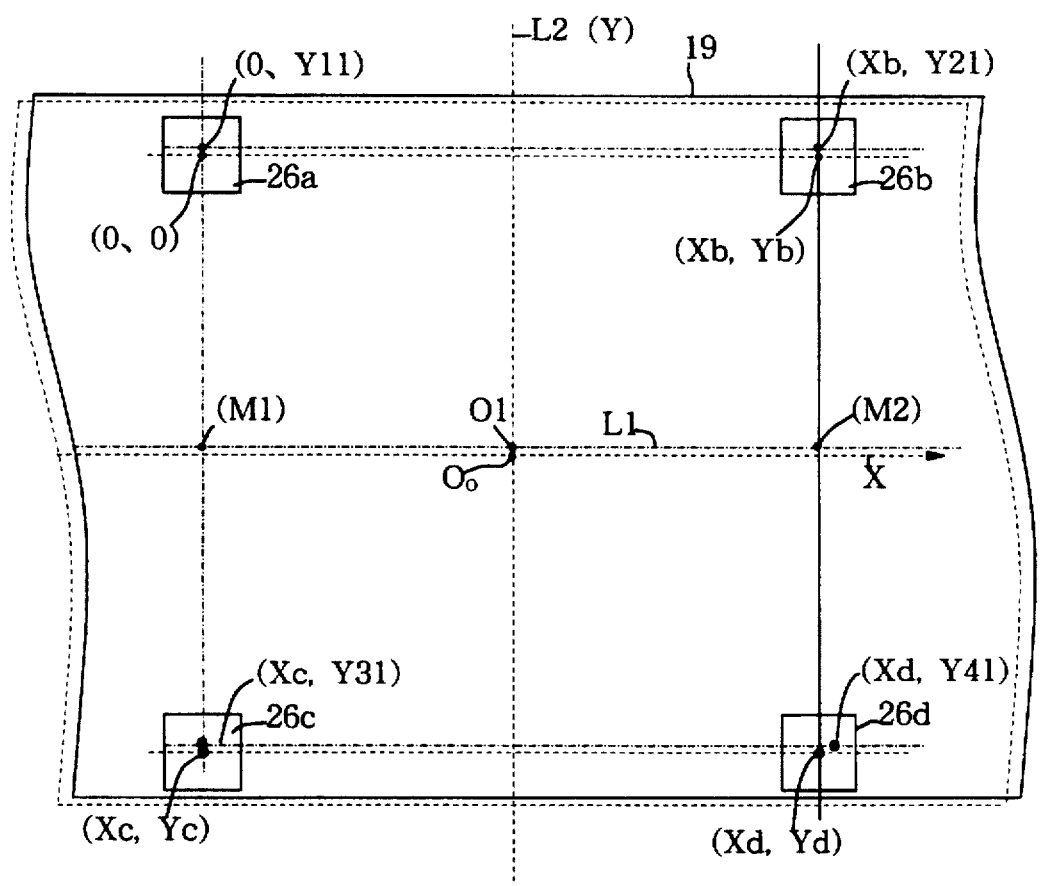
FIG. 29 illustrates the positional alignment in the direction of the X-axis in the positional alignment based upon the image information obtained by using the image processing cameras.
Figure 30:
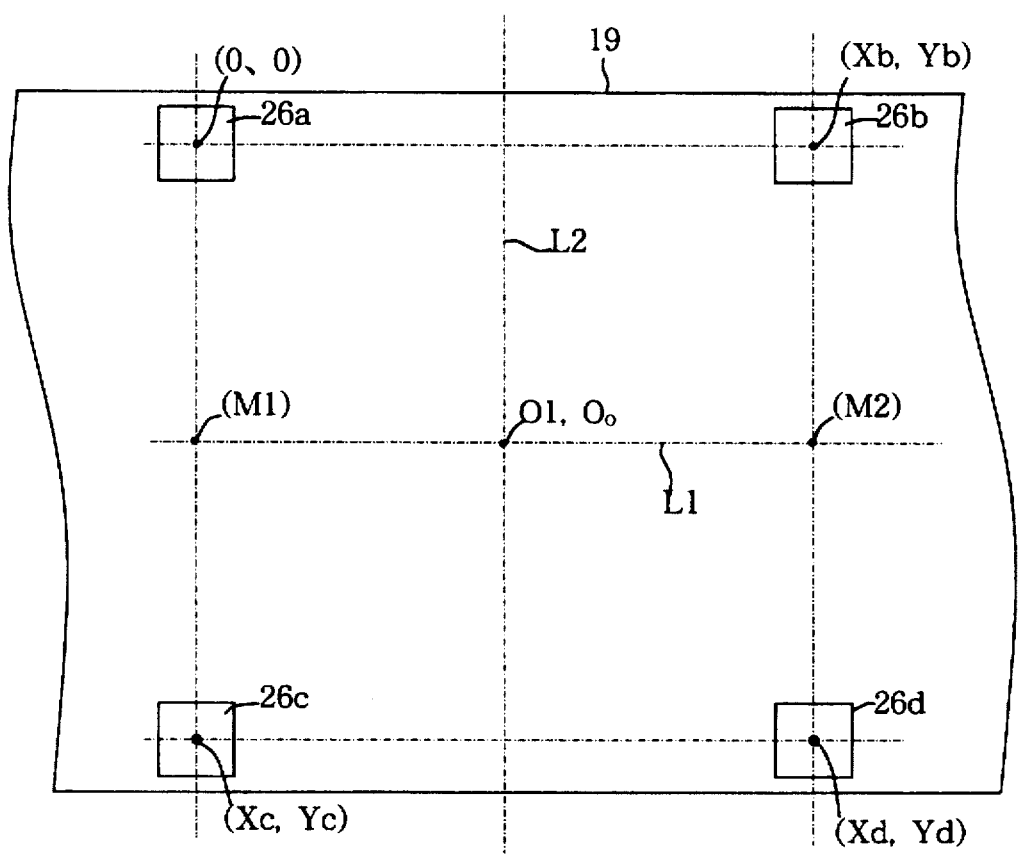
FIG. 30 illustrates the positional alignment in the direction of the Y-axis in the positional alignment based upon the image information obtained by using the image processing cameras.

FIG. 28 shows a state after correction of the angle θ is performed, FIG. 29 shows a state after positional alignment in the direction of the X-axis is performed and FIG. 30 shows a state after positional alignment in the direction of the Y-axis is performed. Note that in the actual positional alignment operation, the dead mid-point O1 is aligned to the mid-point $O_o$ of the cameras 26a to 26d while correcting the angle θ.

While the four cameras 26a to 26d are used to improve the accuracy in this embodiment, two first target marks and two cameras can achieve image processing/printing satisfactorily by determining the mid-point between the two points, determining the offset angle θ between the two points and by performing processing with a computer. Since the surface of the table 25 is a vacuum holding surface, it can move accurately in X-direction Y-direction and θ-direction. After the image processing is performed in this manner, the table 25 is moved in Z-direction by a given distance so that it comes in contact with the rear surface of the flexible supporting body and then screen printing is performed.

After the printing, the flexible supporting body 19 is moved by a fixed-length feed device 29 (see FIG. 20) by a fixed distance and then is fed to the position where cameras 30a to 30d for correction are provided. The surface of the fixed-length feed device 29 that comes in contact with the flexible supporting body 19 is a vacuum holding surface and consequently, the rear surface of the flexible supporting body 19 is fixed by suction on to the vacuum holding surface of the fixed-length feed device 29. Then, the pitch mark (e1) is read by a sensor (camera) 268, and also, until the following pitch mark (e1) is read by the sensor, the fixed-length feed is applied to the flexible supporting body 19. Thus, since the fixed-length feed over a specific distance, which is equivalent to the distance between the adjacent pitch marks (e1) and (e1) is applied, problems such as the first target marks (a1) to (d1) going out of the field of view of the cameras 30a to 30d because of delivery misalignment or the like are prevented. Furthermore, since the surface of the fixed-length feed device 29, which comes in contact with the flexible supporting body 19, is a vacuum holding surface, the flexible supporting body 19 does not become misaligned on the fixed-length feed device 29 during a fixed-length feed operation.

Figure 31:
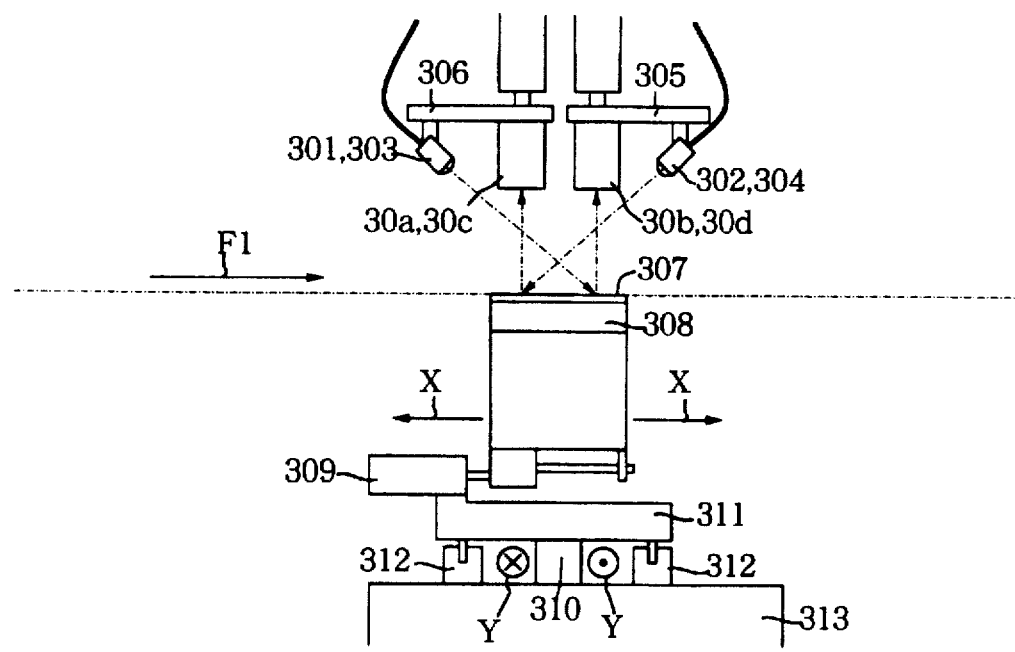
FIG. 31 shows the stage on which the correction cameras are placed.

While the stations of the cameras 30a to 30d for correction are different from those of the cameras 26a to 26d, their positional relationship are identical to those among the cameras 26a to 26d. FIG. 31 shows the stage on which the cameras 30a to 30d for correction are positioned. The cameras 30a to 30d for correction capture the optical image that is radiated from projection lamps 301 to 304 and which also is reflected by the first target marks (a1) to (d1) and the second target marks (a2) to (d2), to detect the first target marks (a1) to (d1) and the second target marks (a2) to (d2). The projection lamps 301 to 304 are supported by support arms 305 and 306. At this point, the positional misalignment which occurs while mounting the pattern engraving is measured by ascertaining the misalignment between the first target marks (a1) to (d1) and the second target marks (a2) to (d2), i.e., by reading their coordinates in the same manner as that used for image processing explained earlier. Then, based upon the measured data, data processing is performed by a computer system (not shown) to calculate required correction quantities and these data are fed back to the control system of the table 25 so that the table 25 is driven for positional correction.

While the explanation above is given on a case in which four cameras 30a to 30d are employed, the structure may feature eight cameras instead, to read the first target marks (a1) to (d1) and the second target marks (a2) to (d2) at the same time with the eight cameras. The positional relationship between the first target marks (a1) to (d1) and the second target marks (a2) to (d2) can be clarified in advance by using a standard reference engraving in which the first target marks (a1) to (d1) are printed (for instance, a glass standard engraving).

While, in this embodiment, four cameras 30a to 30d for correction are used in order to increase accuracy, computer processing is also possible with two first target marks and two cameras by determining the mid point between the two points and determining the offset angle θ between the two points. The stage on which the cameras 30a to 30d for correction are provided is constituted with an X-direction drive device 309, a Y-direction drive device 310, a supporting member 311, a guide rail 312 and the support platform 313.

While in this embodiment, the printing table 25 is driven, it may also be possible to drive the engraving 27 as shown in FIGS. 20 and 21 in the same X-direction Y-direction and θ-direction.

The ceramic layer 43 on which the electrodes are formed in the manner described above then goes through the light table for visual inspection 31 and the guide roller 32 and then is taken up by the conveyer belt 36 which runs a circuit between the rollers 33 and 34. After it goes through the drying treatment in the dryer 35, it travels through the guide roller 37 and the cutter 38 before it is taken up on the take-up roller 39. The rollers 22, 32, 33, 34 and 37 do not come in contact with the printing surface of the flexible supporting body 19 at all and because of this, any adverse effect caused by the rollers 22, 32, 33, 34 and 37 coming in contact with the printing surface is avoided.

(Drying Process)

Dryers in the prior art perform drying with a far infrared light heater, since the solvent used in electrode paste is a solvent with a high boiling point such as terpineol, by heating the solvent with a high boiling point to the boiling point. However, with a far infrared light heater, the drying efficiency is poor, requiring, for instance, 180 seconds of drying time at 90° C.

There is another problem in that during the drying process, the organic flexible supporting body 19, which supports the green sheet and the electrodes, becomes thermally deformed. This thermal deformation amounts to, for instance, 102 µm on one surface in the direction of the thickness of the flexible supporting body 19. When such thermal deformation is present during the process in which electrode patterns are formed on the green sheet 43 by means of printing or the like, a positional misalignment of the electrode patterns results. For instance, if there is shrinkage of 100 µm in the flexible supporting body 19, there will be a positional misalignment of up to 100 µm in the electrode patterns.

Furthermore, as is obvious when we consider the manufacture of laminated ceramic capacitors and the like, when manufacturing this type of ceramic electronic component, the process for forming a green sheet and the process for forming an electrode pattern on top of it are both repeated in correspondence to the number of laminated layers required, and positional misalignment in the electrode pattern will occur every time. The misalignment will be multiplied by the number of laminated layers, until the required characteristics cannot be achieved.

According to the present invention, in order to solve the problems described above, a dryer 35, which includes a means for hot air supply, is employed. The dryer 35 is provided with a drying chamber 350, through which the flexible supporting body 19 with undried electrodes on it, passes. By passing through hot air in the drying chamber 350, the dryer 35 dries the fresh electrodes on the flexible supporting body 19 with hot air. The drying chamber 350 is provided with an air supply passage 351 at one end and an air discharge passage 352 at the other end. The hot air that has flowed into the drying chamber 350 from the air supply passage 351, as indicated with the arrow J1, passes through the inside of the drying chamber 350 and is then discharged via the air discharge passage 352 in the direction indicated with the arrow J2.

With the hot air drying described above, a reduced drying time, which is approximately ⅓ of that in the prior art, is required at a low drying temperature of, for instance, 45° to 80° C. Moreover, the quantity of deformation of the flexible supporting body 19 is minimized. To be more specific, the quantity of deformation of the flexible supporting body 19 is kept at 20 µm or less.

Figure 32:
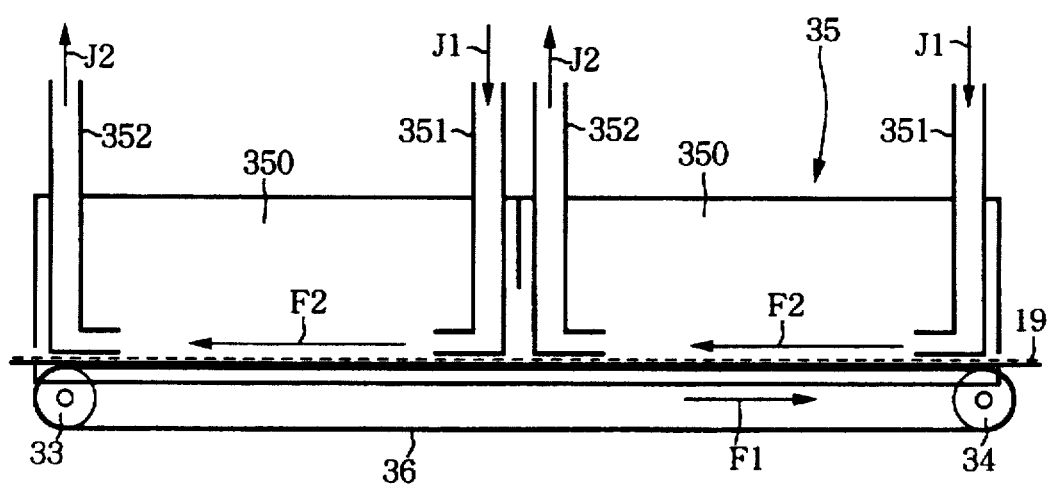
FIG. 32 shows an embodiment of the dryer.

FIG. 32 shows a specific example of the dryer 35. In FIG. 32, the dryer 35 is provided with a plurality of drying chambers 350. Each drying chamber 350 is provided with an air supply passage 351 at one end, which constitutes the exit side relative to the direction F1 in which the flexible supporting body 19 is fed, and an air discharge passage 352 at the other end, which constitutes the entrance side. Consequently, the electrodes on the flexible supporting body 19 are dried with hot air, which flows in the direction F2, which is opposite from the direction F1 in which the flexible supporting body 19 is fed.

Figure 33:
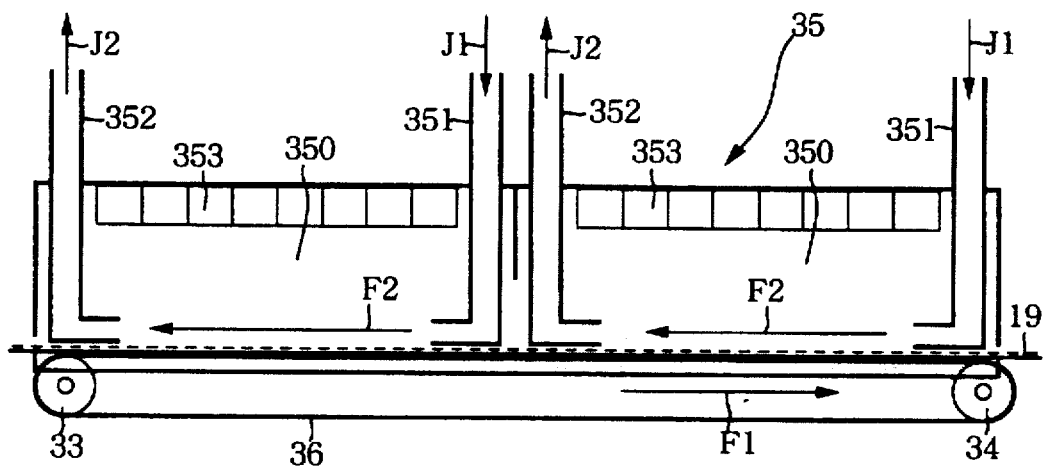
FIG. 33 shows another embodiment of the dryer.

FIG. 33 shows another embodiment of the dryer. In the embodiment shown in FIG. 33, each of a plurality of drying chambers 350 is provided with an air supply passage 351 at one end, which constitutes the exit side relative to the direction F1 in which the flexible supporting body 19 is fed, an air discharge passage 352 at the other end, which constitutes the entrance side, and is provided with a far infrared light heater 353. Consequently, in the embodiment shown in FIG. 33, the drying effect provided by the far infrared light heater 353 is obtained in addition to the drying effect of the hot air supplied through the air supply passage 351. The temperature of the air supplied via the supply air passage 351 is adjusted in correspondence to the quantity of heat supplied by the far infrared light heater 353. Depending upon the quantity of heat supplied by the far infrared light heater 353, it is even possible to supply air at room temperature. In this case, too, by generating gas flow inside the drying chambers 350, a layer of saturated vapor constituted of the solvent present in the drying chambers 350 is removed, to achieve quick drying.

Figure 34:
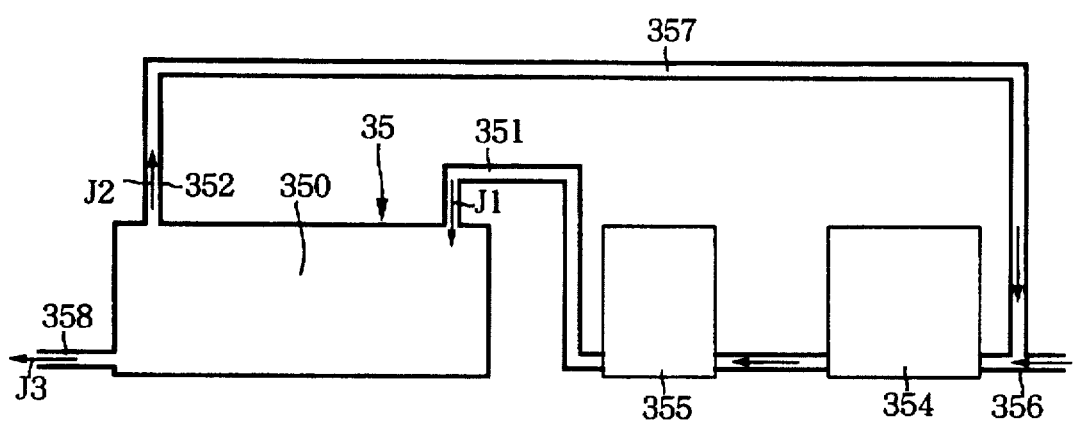
FIG. 34 shows an embodiment of the hot air generating device used in the dryers shown in FIGS. 32 and 33.

FIG. 34 shows the structure of a hot air generating device, which supplies hot air to the dryer 35. The hot air generating device is provided with a hot air generator 354 and a heppar filter 355 which has a high performance to filter air. The hot air generator 354 is, in turn, provided with a heater, an air blower and the like (not shown), and heats the air supplied from an air intake passage 356 and then propels it out. The filter 355 improves the cleanness of the hot air sent out from the hot air generator 354 and supplies it to the drying chambers 350 via the air supply passages 351. The air discharge passages 352, which are continuous with the drying chambers 350, extend through a return passage 357 to join the intake passage 356. With this circulation, the thermal efficiency is improved. Each drying chamber 350 may be provided with another air discharge passage 358.

(Process for achieving the preset number of laminated layers)

a. In conformance to the manufacturing flow chart shown in FIG. 1

The flexible supporting body with a green sheet, upon which electrodes have been printed in the manner explained earlier, is sent to the green sheet formation process shown in FIG. 4, in which it is mounted on to the delivery roller 11 again. Then it goes through the snaking correcting roller 13 and is controlled to achieve a specific desired green sheet thickness, as was done in the first green sheet formation. Then, the process in which electrodes are printed based upon the image processing performed by the image processor printer, shown in FIG. 20, is repeated as many times as necessary to achieve the required number of laminated layers.

Figure 35:
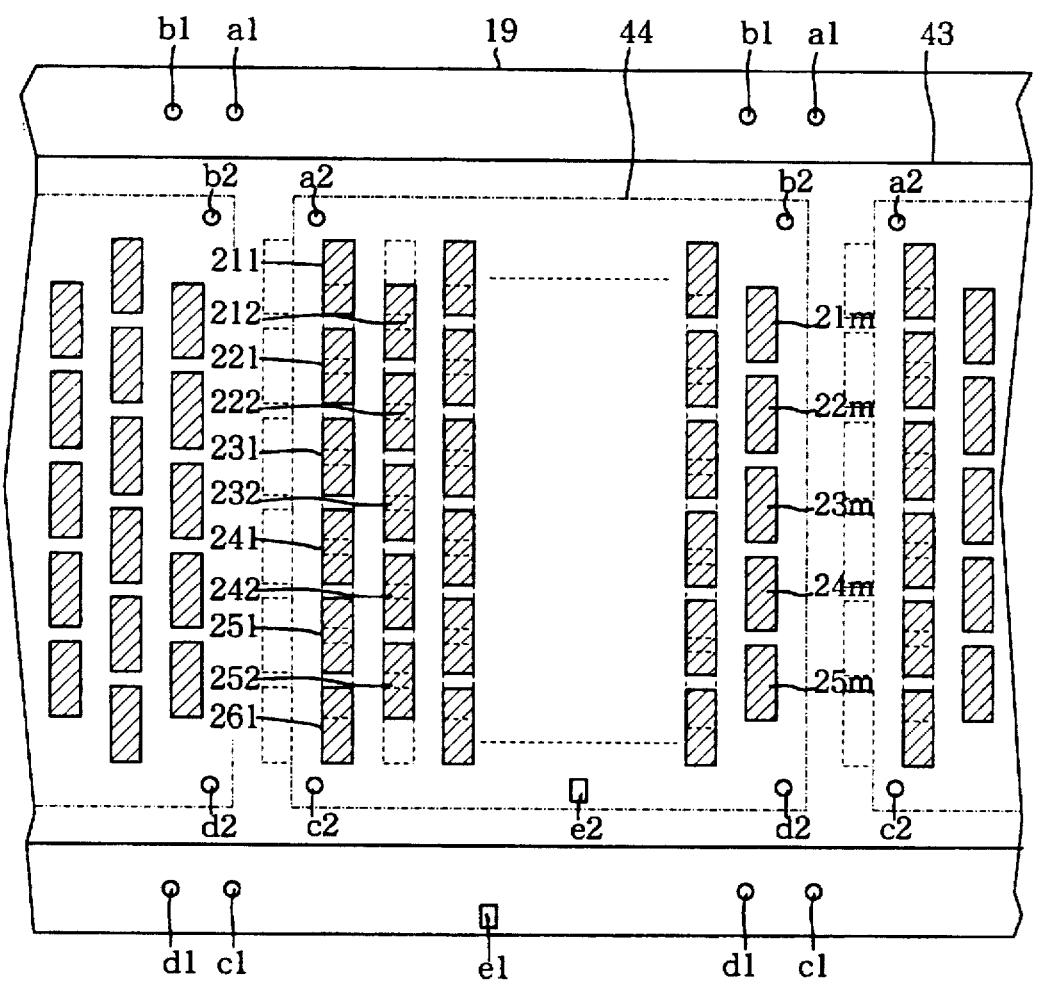
FIG. 35 is a plan view of the flexible supporting body obtained after the second printing of electrodes is performed by the image processor/printer shown in FIG. 20.
Figure 36:
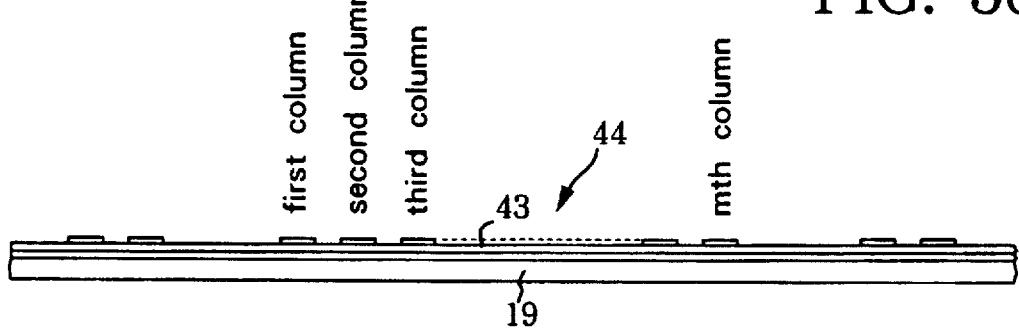
FIG. 36 is a side view of the flexible supporting body shown in FIG. 35.

FIGS. 35 and 36 show the electrode printing positions in the second and subsequent electrode printing processes, and they show that printing is performed by offsetting the electrodes by 1 column relative to the previous electrode positions. If the electrode pattern has been changed, the X-Y-θ-Z table 25 is controlled in X-direction, Y-direction or θ-direction in correspondence to the electrode pattern, in such a manner that the required overlay of the electrode patterns is achieved.

Figure 37:
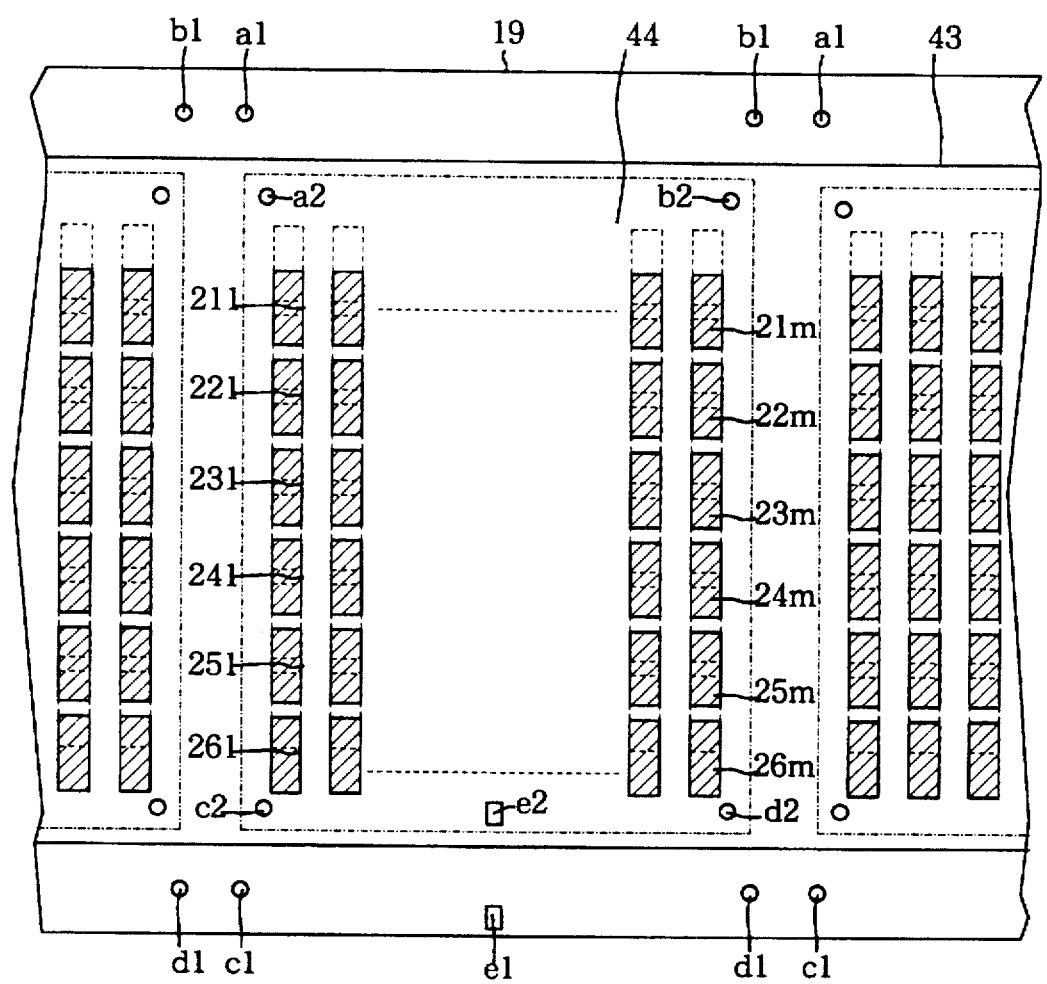
FIG. 37 is a plan view of another example of electrodes obtained through the image processor/printer shown in FIG. 20.

For instance, if, as shown in FIG. 37, the electrode pattern 44 has identical electrode columns arrayed over a distance, the second electrode pattern 44 is moved in the direction of the width of the flexible supporting body 19 relative to the first electrode pattern. Since the X-Y-θ-Z table 25 can move freely in X-direction, Y-direction and θ-direction, it is possible to control the X-Y-θ-Z table 25 by a computer system in such a manner that the required overlay of the electrode patterns is achieved by inputting positional information on the first target marks (a1) to (d1) obtained by the cameras 26a to 26d to the computer system. This second and subsequent green sheet formation and the image processing/printing are repeated until the desired number of laminated layers is achieved. Then, finally, a second protective layer 56B is formed to achieve a thickness of, for instance, 160 µm.

Figure 38:
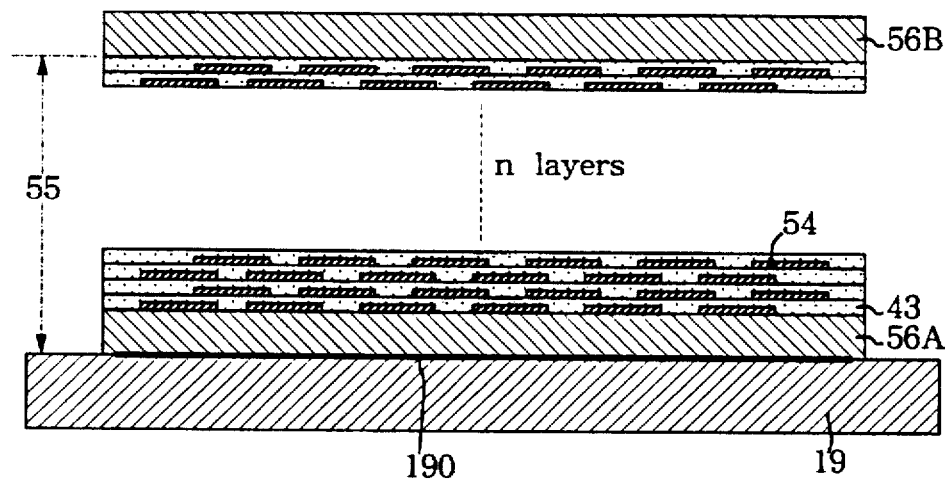
FIG. 38 is a cross section of a laminated body obtained through the manufacturing method according to the present invention illustrated in FIG. 1.
Figure 39:
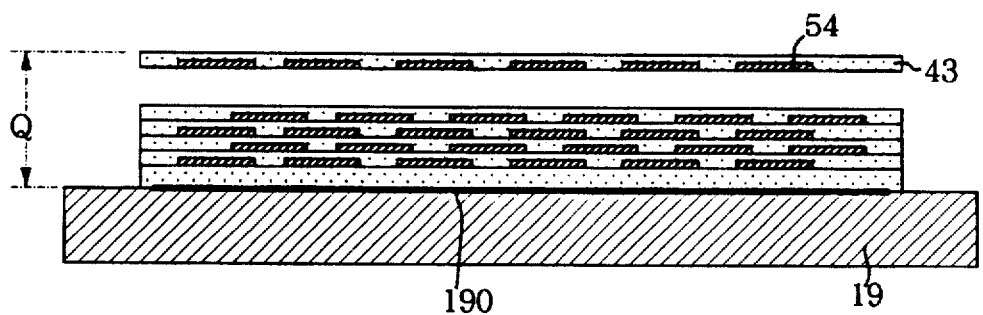
FIG. 39 is a cross section of another laminated body obtained through the manufacturing method according to the present invention illustrated in FIG. 2.

FIG. 38 is a cross section of the laminated body obtained through the procedure described above, with the laminated green sheet 55 formed on the flexible supporting body 19. Reference numbers 56A, 43, 54 respectively indicate a first protective layer, the green sheet and dried electrodes.

b. In conformance to the manufacturing flow chart shown in FIG. 2

When the procedure in conformance to the manufacturing flow chart shown in FIG. 2 is to be adopted, after executing the green sheet formation process and the printing process a plurality of times, the laminated green sheets thus obtained are peeled off the flexible supporting body and then the plurality of peeled laminated green sheets are laminated on top of a first protective layer that has been separately formed by sheeting. Next, a second protective layer that has been separately formed by sheeting is laminated over the uppermost layer of the laminated body thus obtained.

Figure 40:
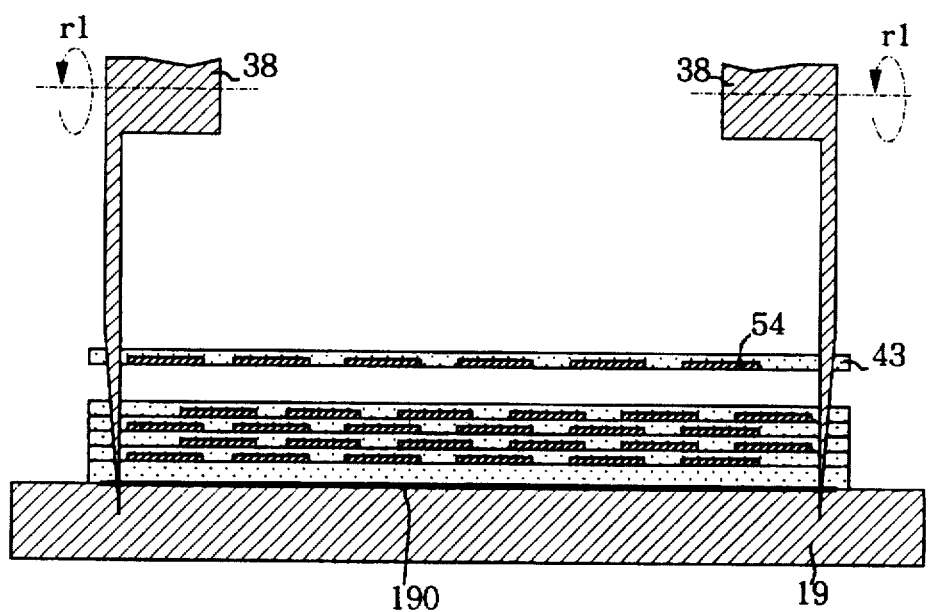
FIG. 40 illustrates the cutting process in which the laminated body shown in FIG. 39 is cut.
Figure 41:
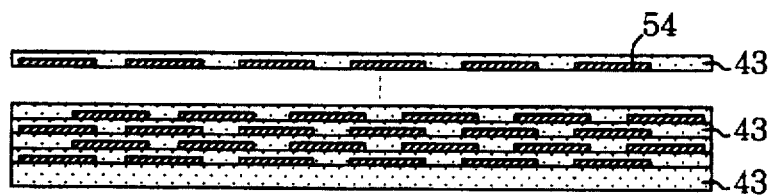
FIG. 41 is a cross section of the laminated body obtained through the cutting process illustrated in FIG. 40.

FIGS. 39 to 43 show a specific example of this. After executing the green sheet formation process and the printing process for (Q) times (see FIG. 39), the laminated green sheet layers thus obtained are peeled off the flexible supporting body. In the peeling process, as shown in FIG. 40, both ends of the laminated green sheet in the direction of their width are cut by the cutter 38 prior to peeling, and then the laminated green sheet is peeled off the flexible supporting body 19. FIG. 41 shows a cross section of the laminated green sheet obtained by peeling. After the laminated green sheet is cut by the cutter 38, the laminated green sheet is supported on the flexible supporting body 19 only by the peeling film 190, thus, the laminated green sheet is peeled off the flexible supporting body 19 very smoothly.

Figure 42:
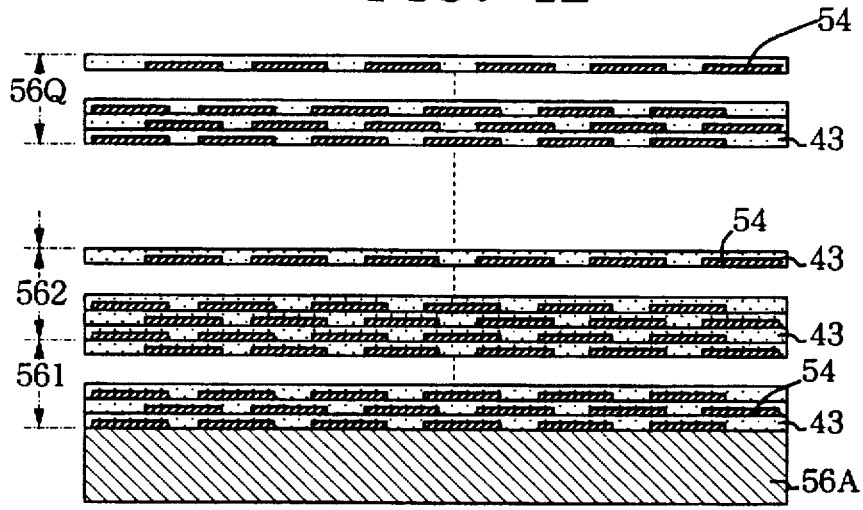
FIG. 42 illustrates the process in which the laminated body shown in FIG. 41 is further laminated.
Figure 43:
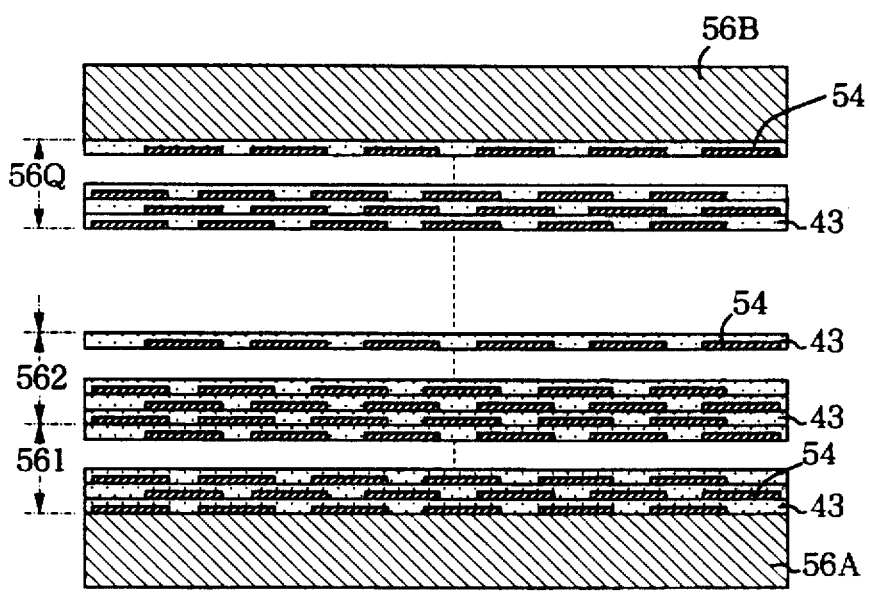
FIG. 43 illustrates the process in which a protective layer is laminated on the laminated body shown in FIG. 42.

Next, as shown in FIG. 42, the plurality of laminated green sheets 561 to 56Q obtained by peeling are laminated on top of the first protective layer 56A which has been separately formed by sheeting. Then, finally, a second protective layer 56B as shown in FIG. 43, is formed to achieve a total thickness of, for instance, 160 µm.

(Process after the preset number of laminated layers has been achieved)

a. In conformance to the manufacturing flow chart shown in FIG. 1

Figure 44:
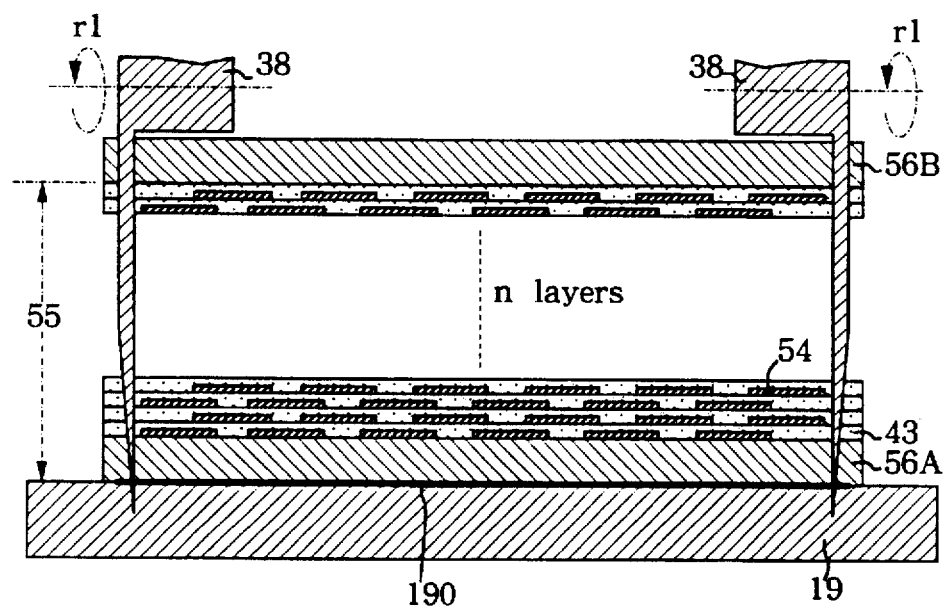
FIG. 44 illustrates the cutting process in which the laminated body shown in FIG. 38 is cut.
Figure 45:
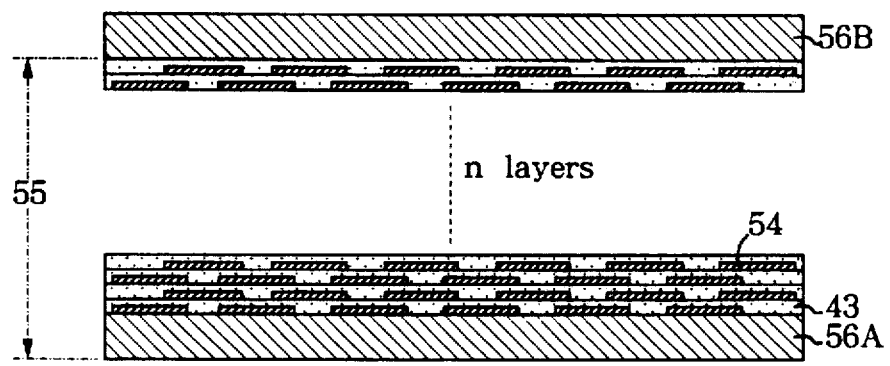
FIG. 45 is a cross section of the laminated body obtained through the cutting process illustrated in FIG. 44.

When the procedure in conformance to the manufacturing flow chart shown in FIG. 1 is to be adopted, the obtained laminated green sheet is fed into the area between the guide roller 37 and the cutter 38. Both ends in the direction of the width of the final laminated body are cut by the cutter 38 and then the laminated green sheet is peeled off the flexible supporting body 19. FIG. 44 shows the cutting process performed by the cutter 38, in which the two ends in the direction of the width of the final laminated body are cut off by the cutter 38, which is rotating in the direction indicated with the arrow (r1). The cutter 38 cuts into the laminated green sheet constituted with the green sheets 43 and the electrodes 54 with its blade tip located at the peeling film 190. Then, the laminated green sheet constituted with the green sheets 43 and the electrodes 54 is peeled off the flexible supporting body 19 and is taken up onto the take-up roller 39. After the laminated green sheet is cut by the cutter 38, the laminated green sheet is supported on the flexible supporting body 19 only by the peeling film 190. Thus, the laminated green sheet is peeled off the flexible supporting body 19 very smoothly. The remaining flexible supporting body 19, too, is taken up onto a take-up roller (not shown). FIG. 45 shows a cross section of the laminated body obtained by peeling.

Then, processes such as pressing, cutting, de-binding, baking and terminal electrode formation are executed to obtain laminated capacitors.

b. In conformance to the manufacturing flow chart shown in FIG. 2

When the procedure in conformance to the manufacturing flow chart shown in FIG. 2 is to be adopted, after obtaining the plurality of laminated green sheets 561 to 56Q with the first protective layer 56A and the second protective layer 56B, processes such as cutting, de-binding, baking and terminal electrode formation are executed to obtain laminated capacitors.

The requirements for de-binding and baking are identical to those in the known art. For instance, de-binding is performed for 12 hours at 280° C. and then baking is performed for 2 hours at 1300° C. in a reducing atmosphere. A terminal electrode 4 (see FIG. 3) is formed on the laminated body obtained by baking. The materials and method used for forming the terminal electrode 4 are also identical to those in the known art. For instance, copper is used as a main constituent and baking is performed for 30 minutes at 800° C. in an atomosphere of ($N_2+H_2$) before plating.

(Evaluation of characteristics)

Next, using data, specific advantages of the present invention are explained.

(Evaluation of characteristics 1: advantages achieved mainly through the non-contact rollers and positional alignment using the image processing device)

TABLE 1 shows the results of a characteristics evaluation made on laminated ceramic capacitors produced through the manufacturing method described above and on laminated ceramic capacitors produced through the manufacturing method of the prior art. In TABLE 1, test pieces Nos. 1 to 3 were laminated ceramic capacitors produced through the manufacturing processes shown in FIG. 1, test piece No. 6 is a laminated ceramic capacitor produced through the manufacturing processes shown in FIG. 2 and test pieces Nos. 4 and 5 were laminated ceramic capacitors produced through the manufacturing method of the prior art.

TABLE 1

| No. | green sheet thickness (µm) | number of laminated layers | capacitance (µF) | tan δ (%) | insulating resistance (Ω) | breakdown voltage (v) | laminating method | surfactant (wt %) |
| --- | --- | --- | --- | --- | --- | --- | --- | --- |
| 31 | 8.0 | 75 | 1.01 | 1.86 | $1.8 \times 10^9$ | 230 | FIG. 1 | sulfonic acid type 1.0 |
| 32 | 2.5 | 150 | 6.66 | 1.91 | $4.2 \times 10^8$ | 80 | FIG. 1 | phosphoric ester type 1.0 |
| *33 | 8.0 | 75 | 0.91 | 1.88 | $1.7 \times 10^9$ | 150 | prior art | none |
| *34 | 2.5 | 150 | not measured because lamination not possible | | | | prior art | none |

TABLE 1-continued

| No. | green sheet thickness (μm) | number of laminated layers | Δ Gmax -av (μm) | yield (%) | shorting defect rate (%) | laminating method | surfactant (wt %) |
| --- | --- | --- | --- | --- | --- | --- | --- |
| 31 | 8.0 | 75 | 8 | 97 | 0.00 | FIG. 1 | sulfonic acid type 1.0 |
| 32 | 2.5 | 150 | 13 | 97 | 0.08 | FIG. 1 | phosphoric ester type 1.0 |
| *33 | 8.0 | 75 | 250 | 33 | 33.2 | prior art | none |
| *34 | 2.5 | 150 | not measured because lamination not possible | | | | none |

*: comparison example

In test piece No. 1, the green sheet thickness was at 8.0 μm while the thickness of one layer in the dielectric layers 2 after baking was 5 μm with the number of laminated layers at 75. In test piece No. 2, the green sheet thickness was at 2.5 μm while the thickness of one layer in the dielectric layers 2 after baking was 1.5 μm with the number of laminated layers at 75. In test piece No. 3, the green sheet thickness was at 2.5 μm while the thickness of one layer in the dielectric layers 2 after baking was 1.5 μm with the number of laminated layers at 150.

In test piece No. 4, the green sheet thickness was at 8.0 μm while the thickness of one layer in the dielectric layers 2 after baking was 5 μm with the number of laminated layers at 75. In test piece No. 5 the green sheet thickness was at 2.5 μm while the thickness of one layer in the dielectric layers 2 after baking was 1.5 μm with the number of laminated layers at 150. However, note that in the case of test piece No. 5, because of the small thickness of the green sheet, at 2.5 μm, they could not be laminated to achieve the number of laminated layers required to achieve the desired characteristics for a laminated ceramic capacitor (lamination not possible).

In test piece No. 6, the green sheet thickness was at 8.0 μm while the thickness of one layer in the dielectric layers 2 after baking was 5 μm with the number of laminated layers at 75. In all the test pieces 1 through 6, the external dimensions were fixed at 3.2 mm×1.6 mm. The measurement of their thickness varied, depending upon the number of laminated layers and the thickness of each layer in the dielectric layers.

On these laminated ceramic capacitors, evaluation tests to determine the number of pinholes (quantity/10 m), the electrostatic capacitance, the dielectric loss, the insulating resistance, the breakdown voltage, the shorting defect rate, the printing misalignment and the yield were performed. TABLE. 1 shows the results of the evaluation made on the tests. For each of test pieces Nos. 1 to 6, the number of samples subjected to testing was 30,000.

When making comparisons between the manufacturing method according to the present invention and the prior art technology based upon the results of the evaluation tests shown in TABLE 1, they were made between the test pieces having the same number of green sheets and laminated layers. To be more specific, comparisons were made between test pieces Nos. 1 and 6 and test piece No. 4, also between test pieces Nos. 2 and 3 and test piece No. 5.

a. Electrostatic capacitance, dielectric loss.

Measurement was made using a Hewlett Packard impedance analyzer HP-4284A at 20° C. While the electrostatic capacitance in test piece No. 4 was 0.91 μF, the electrostatic capacitances in test pieces Nos. 1 and 6 were 1. 01 μF and 1.03 μF respectively, indicating that test pieces Nos. 1 and 6 produced through the manufacturing method according to the present invention achieved greater electrostatic capacitances than test piece No. 4, produced through the manufacturing method of the prior art. This is thought to be attributable to the high precision with which the embedded electrodes overlay one another in the present invention.

In the comparison of test pieces Nos. 2 and 3 against test piece No. 5, while lamination was not possible with test piece No. 5 with the green sheet thickness at 2.5 μm, in test pieces Nos. 2 and 3 produced through the manufacturing method according to the present invention, electrostatic capacitances of 3.3 μF and 6.63 μF respectively were achieved using thin green sheets with a thickness of 2.5 μm.

As for tan δ (%), the measurement for test piece No. 4 was 1.88% while those for test pieces Nos. 1 and 6 were 1.86% and 1.85% respectively, indicating that the dielectric loss in test pieces Nos. 1 and 6 was reduced compared to that in test piece No. 4. Test pieces Nos. 2 and 3, in which extremely thin green sheets, i.e., 2.5 μm were used, still achieved low dielectric losses of 1.87% and 1.96% respectively.

b. Insulating resistance and shorting defect rate.

10V was applied by the Hewlett Packard high ohm meter HP-4329A at 20° C. and measurement was made 30 seconds later. It was decided that a shorting defect occurred when the insulating resistance was at 1000Ω or less, and for each of the test pieces Nos. 1 to 6, the shorting defect rate was expressed as the ratio of the number of shorting defects against the entire number of samples subjected to testing.

While the insulating resistance was $1.7 \times 10^9 \Omega$ in test piece No. 4, those in test pieces Nos. 1 and 6 were $2.0 \times 10^9 \Omega$ and $3.1 \times 10^9 \Omega$ respectively, indicating that test pieces Nos. 1 and 6 produced through the manufacturing method according to the present invention achieve greater insulating resistance compared to test piece No. 4, produced through the manufacturing method of the prior art. In addition, test pieces Nos. 2 and 3 also provided large insulating resistances of $7.1 \times 10^8 \Omega$ and $4.6 \times 10^8 \Omega$ respectively. This is thought to be attributable to the fact that in the present invention, the thickness of the green sheets is consistent.

While the shorting defect rate in test piece No. 4 was 33.2%, those in test pieces Nos. 1 and 6 were 0.7% and 0.4% respectively, with a great reduction in the shorting defect rate achieved in test pieces Nos. 1 and 6, obtained through the manufacturing method according to the present invention compared against test piece No. 4, manufactured through the prior art method. In test pieces Nos. 2 and 3 also, the shorting defect rates were kept at 0.8% and 1.0% respectively.

c. Breakdown voltage.

In order to evaluate the breakdown voltage, measurement was made by an automatic booster testing device. While the breakdown voltage in test piece No. 4 was 150V, in test pieces Nos. 1 and 6 the breakdown voltage was 230V in both, indicating that test pieces Nos. 1 and 6 produced through the manufacturing method according to the present invention, achieve greater breakdown voltage compared to test piece No. 4, produced through the manufacturing method of the prior art. Even test pieces Nos. 2 and 3, with an extremely small green sheet thickness, at 2.5 μm (thickness after drying 1.5 μm), achieved breakdown voltages of 90V and 80V respectively.

d. Printing misalignment.

Figure 46:
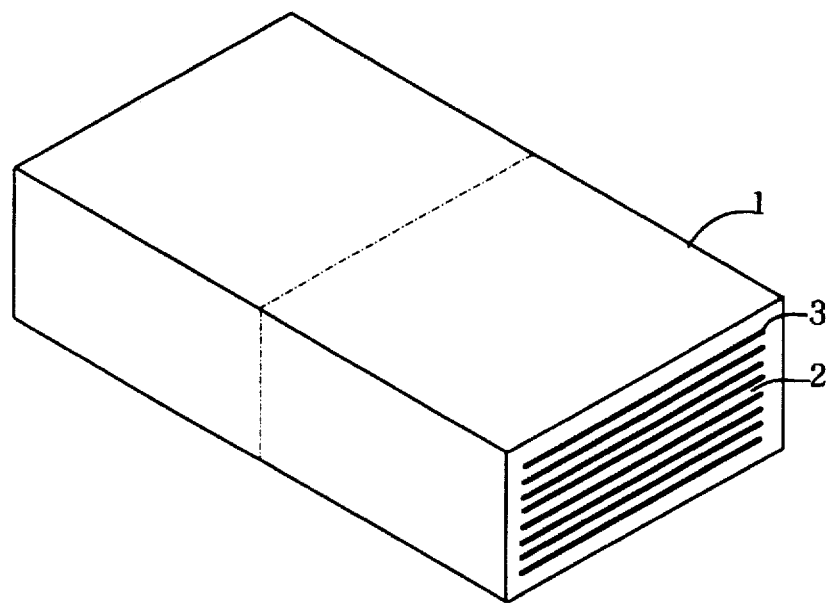
FIG. 46 is a perspective view of the laminated green chip obtained by pressing and cutting the laminated body shown in FIG. 43 or FIG. 45.
Figure 47:
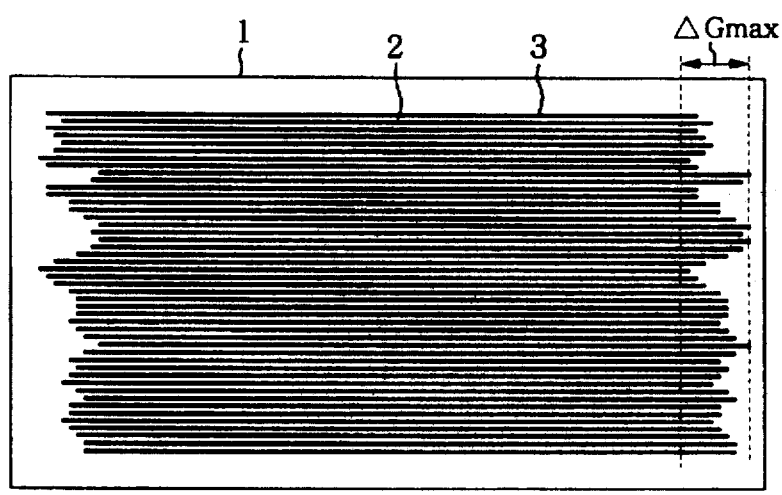
FIG. 47 illustrates the definition of the maximum value ΔGmax of the positional misalignment of electrodes.

Laminated ceramic capacitors were cut along the dotted line in FIG. 46 and the average value ΔGmax-av of the maxima values ΔGmax (see FIG. 47) of the quantities of positional misalignment of 10 electrodes in each cut surface was measured. While the average value ΔGmax-av for test piece No. 4 was 250 μm, the corresponding values in test pieces Nos. 1 and 6 were 8 μm and 11 μm respectively, indicating that the printing misalignment was greatly reduced in test pieces Nos. 1 and 6 produced through the manufacturing method according to the present invention, compared to test piece No. 4 produced through the manufacturing method of the prior art. Test pieces Nos. 2 and 3 also achieved a great reduction in printing misalignment with their average ΔGmax-av values at 12 μm and 13 μm respectively. This advantage was achieved through image processing.

e. Number of pinholes (quantity/10 m).

In each of test pieces Nos. 1 to 3 and No. 6, which were produced through the manufacturing method according to the present invention, the number of pinholes was 0/10 m. In contrast, in test piece No. 4, produced through the manufacturing method according to the prior art, 49 pinholes/10 m were observed, while in test piece No. 5, 84 pinholes/10 m were observed. This is thought to be attributable to the fact that, in the manufacturing method according to the present invention, the surface of the flexible supporting body on to which the dielectric paste was applied does not come in contact with the rollers, either before or after the application. Thus, no pinholes are formed because of the green sheets becoming sloughed off. In the manufacturing method according to the prior art, on the other hand, the surface of the flexible supporting body on to which the dielectric paste was applied comes in contact with the rollers before and after the application, which frequently results in pinholes caused by the green sheets being soughed off.

f. Yield.

While the yield for test piece No. 4 was 33%, test pieces Nos. 1 and 6 both achieved a yield of 92%. Also, test pieces Nos. 2 and 3 achieved high yields of 92% and 90% respectively. In the manufacturing method according to the present invention, the yield was greatly improved.

To sum up the reason for this, according to the present invention, thin green sheets, with a thickness of 2.5 μm, which cannot be laminated in the prior art, are laminated with a high degree of precision. Consequently, laminated ceramic capacitors with a low shorting defect rate and outstanding characteristics may be manufactured with a high yield. Moreover, an extremely good effect was achieved with green sheets at a thickness of 8 μm, which is the maximum thickness that allows lamination in the prior art.

Furthermore, in the prior art method, there are steps between the areas where the electrodes are provided and the areas where no electrodes are provided, the number of which equals the product of the thickness of each electrode and the number of electrodes. Since, according to the present invention, another green sheet is formed on top of a green sheet on which image processing/printing has been performed, these steps tend to be eliminated. The results of experiment indicate that steps that previously amounted to 2 μm per electrode were reduced to steps amounting to 1.5 μm per electrode. Thus, the steps were reduced if very slightly.

The value appears insignificant when considering a single electrode, but with the number of laminated layers increased to, for instance, 150 layers, a total of 0.5 μm×150=75 μm is eliminated.

(Evaluation of characteristics 2: Effect of volumetric ratio of ceramic particles)

a. volumetric ratio of the ceramic particles and its effect.

In the ceramic coating applicator device according to the present invention, ceramic coatings with differing volumetric ratios of the ceramic particles were used to form green sheets with differing thicknesses for each type of ceramic coating by controlling the flow rate of the coating with a mass flowmeter and a quantitative decision pump. TABLE 2 shows the number of micro pinholes for each green sheet film thickness and each volumetric ratio of the ceramic particles.

TABLE 2

| green sheet thickness (μm) | number of micro pinholes volumetric ratio of ceramic particles (vol %) | | | | |
|---|---|---|---|---|---|
| | 3 vol % | 5 vol % | 15 vol % | 20 vol % | 25 vol % |
| 3 μm | 0 | 0 | 0 | 0 | 86 |
| 10 μm | 30★ | 0 | 0 | 0 | 49 |
| 15 μm | 45★ | 0 | 0 | 0 | 0 |

★indicates large pinholes. Other numbers, without the ★, indicate the numbers of micro pinholes. The number of micro pinholes in the table are the numbers within a 10 cm × 10 cm area.

As TABLE 2 indicates, with the volumetric ratio of ceramic particles in the ceramic coating falling within the range of 5% to 20%, the number of micro pinholes is greatly reduced. When the volumetric ratio of the ceramic particles is under 5%, large pinholes are formed. The reason for this is assumed to be an excessively high solvent content in the coating. When the volumetric ratio of the ceramic particles exceeds 20%, the number of pinholes increases, when manufacturing thin green sheets with a thickness of 10 μm or less, while the number of pinholes remains low if the thickness of the green sheet film is at least 15 μm. Consequently, when producing green sheets with a small thickness of 10 μm or less, the volumetric ratio of the ceramic particles in the ceramic coating must be within the range of 5 to 20%. Or, from a reverse perspective, by setting the volumetric ratio of the ceramic particles in the ceramic coating within the range of 5 to 20%, formation of pinholes is prevented even in thin green sheets with a thickness of 10 μm or less. If the ceramic coating layer is too thin, the ceramic coating may become separated from the surface of the flexible supporting body which has been peeling treated, causing formation of pinholes. However, pinholes are not formed when the volumetric ratio of the ceramic particles in the ceramic coating is set within the range of 5 to 20 %, presumably because the ceramic coating layer is laid thick and the phenomenon of the coating becoming separated from the peeling treated surface is prevented, resulting in elimination of pinhole formation.

b. Prevention of streaks.

Using the ceramic coating applicator device according to the present invention, green sheets with a thickness of 3 μm and 10 μm were prepared with a ceramic coating in which the volumetric ratio of the ceramic particles was at 20%. For comparison, using the doctor blade method, green sheets with a thickness of 3 μm and 10 μm were formed with a ceramic coating in which the volumetric ratio of the ceramic particles was at 25% Electrode printing was performed on 1000 m green sheets thus obtained for 10, 000 times and the number of times that electrode printing could not be performed was counted. The results of this measurement are shown in TABLE 3.

TABLE 3

| application method | green sheet thickness | number of streaks | number of times printing was impossible due to sheet defects |
| --- | --- | --- | --- |
| doctor blade | 3 µm | 42 | 4611/10000 |
| extrusion application | 3 µm | 0 | 0/10000 |
| doctor blade | 10 µm | 8 | 341/10000 |
| extrusion application | 10 µm | 0 | 0/10000 |

As shown in TABLE 3, 42 streaks were observed in the 3 µm green sheet formed with the doctor blade method and the number of times that printing was impossible due to sheet defects totalled 4,611. In contrast, in the 3 µm green sheet formed by the ceramic coating applicator device according to the present invention, no streaks were formed and the number of times that printing was impossible due to sheet defects was 0, achieving an extremely good effect in preventing streak formation.

Also, in the 10 µm green sheet formed with the doctor blade method, 8 streaks were observed and the number of times that printing was impossible due to sheet defects totalled 341. In contrast, in the 10 µm green sheet formed by the ceramic coating applicator device according to the present invention, no streaks were formed and the number of times that printing was impossible due to sheet defects was 0, achieving an extremely good effect in preventing streak formation.

In addition, 1000 m of each of the 10 µm green sheets were examined for inconsistency in green sheet thickness over 100 m intervals. In the green sheet produced on the ceramic coating applicator device according to the present invention, the difference between the maximum thickness and the minimum thickness was 0.3 µm, whereas, in the green sheet produced through the doctor blade method, the difference between the maximum thickness and the minimum thickness was 0.8 µm. In the ceramic coating applicator device according to the present invention, since the quantity of ceramic paste supplied from the applicator head is controlled with a high degree of accuracy with the mass flowmeter and the quantitative decision pump, the application thickness of the green sheet to be formed is made constant. As a result, by using a green sheet produced on the ceramic coating applicator device according to the present invention, the layer thickness after baking is set at a constant, stable value, to greatly reduce voltage withstand failures.

c. Advantages achieved in laminated body.

In order to verify advantages achieved in the laminated body, 10 µm green sheets were formed using the ceramic coating applicator device according to the present invention, with a ceramic coating in which the volumetric ratio of the ceramic particles was 20%. These green sheets were laminated one layer at a time to produce a laminated ceramic capacitor with 75 layers. 10,000 such laminated ceramic capacitors were manufactured at 3.2 mm×1.6 mm in size. For comparison, 10 µm green sheets were formed using the doctor blade method with a ceramic coating in which the volumetric ratio of the ceramic particles was 25%. These green sheets were used to produce a laminated ceramic capacitor with 75 layers. 10,000 such laminated ceramic capacitors were manufactured at 3.2 mm×1.6 mm in size. Since it is relatively easy to peel off 10 µm green sheets, it was possible to laminate them one layer at a time. However, it becomes increasingly difficult to peel green sheets as they become thinner than 10 µm. Consequently, when a green sheet thinner than 10 µm is to be obtained through one application process, it is desirable to repeat the green sheet formation process and the electrode printing process for a plurality of times and then peel the green sheet. By following this procedure, a laminated ceramic capacitor constituted with green sheets (dielectric layers) that are thinner than 10 µm may be produced.

The shorting defect rate, the voltage withstand defect rate and the product yield of the laminated ceramic capacitors thus produced are shown in TABLE 4.

TABLE 4

| application method | short defect rate | voltage withstand defect rate | product yield |
| --- | --- | --- | --- |
| doctor blade | 33.2% | 12.8% | 42.7% |
| extrusion application (FIG. 6) | 0.8% | 0.2% | 95.0% |
| extrusion application (FIG. 7) | 0.6% | 0.6% | 94.3% |

As TABLE 4 indicates, with the laminated ceramic capacitors obtained through the doctor blade method, the shorting defect rate, the voltage withstand defect rate and the product yield were at 33.2%, 12.8% and 42.7% respectively. In contrast, the laminated ceramic capacitors obtained on the ceramic coating applicator device according to the present invention, employing the extrusion type applicator head shown in FIG. 6, showed a great improvement with the shorting defect rate, the voltage withstand defect rate and the product yield at 0.8%, 0.2% and 95.0% respectively. When the applicator head shown in FIG. 7 was employed, a great improvement was also achieved with shorting defect rate the voltage withstand defect rate and the product yield at 0.6%, 0.6% and 94.3% respectively.

In ceramic laminated capacitors produced through the doctor blade method, the number of pinholes was high and also there were many streaks formed. In addition, there is great inconsistency in the film thickness. The poor performance with the shorting defect rate, the voltage withstand defect rate and the product yield at 33.2%, 12.8% and 42.7% respectively is thought to reflect these factors. In contrast, with the ceramic coating applicator device according to the present invention, green sheets with a constant film thickness and with a greatly reduced number of pinholes and streaks were achieved. These factors greatly contribute to improving the shorting defect rate, the voltage withstand defect rate and the product yield.

(Evaluation of characteristics 3: advantages achieved by adding a surfactant)

Evaluation tests were performed on the laminated ceramic capacitors obtained through the manufacturing methods described earlier to determine the number of pinholes (quantity/10 m), the electrostatic capacitance, the dielectric loss, the insulating resistance, the breakdown voltage, the shorting defect rate and the yield. TABLE 5 shows the results of this evaluation. In regard to TABLE 5, the ceramic coatings were prepared by adding a phosphoric ester type surfactant or a sulfonic acid type surfactant to the ceramic particles at the quantities (weight %) shown in the table. Laminated ceramic capacitors were then manufactured using these ceramic coatings. While test pieces Nos. 21 to 27 were laminated ceramic capacitors in which the quantity of surfactant added was within the range stipulated in the present invention, test pieces Nos. 28 to 30 were laminated ceramic capacitors in which the quantity of surfactant added was outside the range stipulated in the present invention.

In each of the test pieces Nos. 21 to 30, the thickness of one layer of green sheet was 8.0 μm with the number of laminated layers at 75, which were laminated through the method shown in FIG. 2. For each of the test pieces Nos. 21 to 30, the number of samples subjected to testing was 30,000.

The data presented in TABLE 5 are evaluated by comparing the data on test pieces Nos. 21 to 23 in which a phosphoric ester type surfactant was added, to achieve an added quantity of 0.05 wt % to 5.0 wt %, i.e., within the range stipulated in the present invention, with the data on test piece No. 28, in which a phosphoric ester type surfactant was added to achieve an added quantity of 7.0 wt % i.e., a value outside the range stipulated in the present invention, comparing the data on test pieces Nos. 24 to 26, in which a sulfonic acid type surfactant was added to achieve the added quantity of 0.05 wt % to 5.0 wt %, i.e., within the range stipulated in the present invention, with the data on test piece No. 29, in which a sulfonic acid type surfactant was added to achieve the added quantity of 7.0 wt % i.e., outside the range stipulated in the present invention, and comparing the data on test pieces Nos. 21 to 27 in which at least either one of a phosphoric ester type surfactant or a sulfonic acid type surfactant was added to achieve the added quantity of 0.05 wt % to 5.0 wt %, i.e., within the range stipulated in the present invention, with the data on test piece No. 30, in which neither a phosphoric ester type surfactant or a sulfonic acid type surfactant was added.

Nos. 24 to 26 according to the present invention with a sulfonic acid type surfactant added and test piece No. 29, i.e., a comparison example. Also, there is very little difference in the electrostatic capacitance obtained between test pieces Nos. 21 to 27 according to the present invention, which contain at least either a phosphoric ester type surfactant or a sulfonic acid type surfactant, and test piece No. 30, i.e., a comparison example that does not contain a surfactant.

As for tan δ (%), while the values measured in test pieces Nos. 21 to 23 according to the present invention, in which a phosphoric ester type surfactant was added and in test piece No. 27 according to the present invention, which contained both a phosphoric ester type surfactant and a sulfonic acid type surfactants, ranged between 1.85% and 1.89%, test piece No. 28, i.e., the comparison example, demonstrated poor performance at 1.93%. In addition, the values measured in test pieces Nos. 24 to 26 according to the present invention, in which a sulfonic acid type surfactant was added, ranged between 1.81% and 1.83%, while test piece No. 29, i.e., the comparison example, demonstrated poor performance at 1.91%.

b. Insulating resistance and shorting defect rate.

With a Hewlett Packard high ohm meter HP-4329A, 10V at 20° C. was applied and measurement was made after 30 seconds. It was decided that a shorting defect had occurred when the insulating resistance was at 1000Ω or less, and for each of the test pieces Nos. 21 to 30, the number of shorting defects against the total number of samples subjected to

TABLE 5

| No. | surfactant | added quantity (wt %) | capacitance (μF) | tan δ (%) | insulating-resistance (Ω) | lamination method |
|---|---|---|---|---|---|---|
| 21 | phosphoric ester type | 0.05 | 1.01 | 1.89 | $2.0 \times 10^9$ | FIG. 2 |
| 22 | phosphoric ester type | 1.0 | 1.03 | 1.86 | $1.8 \times 10^9$ | FIG. 2 |
| 23 | phosphoric ester type | 5.0 | 1.03 | 1.88 | $1.9 \times 10^9$ | FIG. 2 |
| 24 | sulfonic acid type | 0.05 | 1.05 | 1.81 | $2.0 \times 10^9$ | FIG. 2 |
| 25 | sulfonic acid type | 1.0 | 1.04 | 1.83 | $2.1 \times 10^9$ | FIG. 2 |
| 26 | sulfonic acid type | 5.0 | 1.04 | 1.82 | $1.8 \times 10^9$ | FIG. 2 |
| 27 | phosphoric ester type sulfonic acid type | 1.0 1.0 | 1.07 | 1.85 | $2.3 \times 10^9$ | FIG. 2 |
| *28 | phosphoric ester type | 7.0 | 1.02 | 1.93 | $1.1 \times 10^9$ | FIG. 2 |
| *29 | sulfonic acid type | 7.0 | 1.04 | 1.91 | $1.9 \times 10^9$ | FIG. 2 |
| *30 | none | 0 | 0.91 | 1.88 | $1.7 \times 10^9$ | prior art |

| No. | surfactant | added quantity (wt %) | Breakdown voltage (v) | shorting defect rate (%) | number of pinholes (quantity/10 m) | yield (%) | lamination method |
|---|---|---|---|---|---|---|---|
| 21 | phosphoric ester type | 0.05 | 250 | 0 | 0 | 97 | FIG. 2 |
| 22 | phosphoric ester type | 1.0 | 280 | 0 | 0 | 98 | FIG. 2 |
| 23 | phosphoric ester type | 5.0 | 260 | 0 | 0 | 96 | FIG. 2 |
| 24 | sulfonic acid type | 0.05 | 250 | 0 | 0 | 98 | FIG. 2 |
| 25 | sulfonic acid type | 1.0 | 280 | 0 | 0 | 98 | FIG. 2 |
| 26 | sulfonic acid type | 5.0 | 280 | 0 | 0 | 98 | FIG. 2 |
| 27 | phosphoric ester type sulfonic acid type | 1.0 1.0 | 280 | 0 | 0 | 97 | FIG. 2 |
| *28 | phosphoric ester type | 7.0 | 240 | 0 | 0 | 63 | FIG. 2 |
| *29 | sulfonic acid type | 7.0 | 240 | 0 | 0 | 53 | FIG. 2 |
| *30 | none | 0 | 150 | 33.2 | 7 | 33 | prior art | green sheet thickness: 8.0 μm number of laminated layer: 75
*indicates a comparison example a. Electrostatic capacitance, dielectric loss. Measurement was made with a Hewlett Packard impedance analyzer HP-4284A at 20° C.

There is very little difference in the electrostatic capacitance obtained between test pieces Nos. 21 to 23 according to the present invention with a phosphoric ester type surfactant added and test piece No. 28, or between test pieces testing constituted a ratio that expressed the shorting defect rate. The data clearly indicate that the shorting defect rate was reduced in test pieces Nos. 21 to 27 according to the present invention, compared to test pieces Nos. 27 to 29 belonging to the prior art technology.

There is very little difference in insulating resistance between test pieces No, 21 to 26 according to the present invention, which contain either a phosphoric ester type surfactant or a sulfonic acid type surfactant, and test piece No. 27 according to the present invention with both a phosphoric ester type surfactant and a sulfonic acid type surfactant. While the insulating resistance values measured in test pieces Nos. 21 to 23 according to the present invention to which phosphoric ester type surfactant was added, and test piece No. 27 according to the present invention with both a phosphoric ester type surfactant and a sulfonic acid type surfactant added, were between 1.8 to $2.3 \times 10^9 \Omega$, test piece No. 28, i.e., the comparison example, demonstrated poor performance at $1.1 \times 10^9 \Omega$. This is thought to be attributable to an excessively high content of phosphorus. In addition, test piece No. 30, which had no surfactant added, demonstrated inferior insulating resistance in comparison to test pieces No. 21 to 27.

c. Breakdown voltage.

The evaluation of breakdown voltage was made through measurements using an automatic booster testing device. While the breakdown voltage values measured in test pieces Nos. 21 to 23 according to the present invention, in which a phosphoric ester type surfactant was added, and test piece No. 27 according to the present invention with both a phosphoric ester type surfactant and a sulfonic acid type surfactant added, were between 250V and 280V, test piece No. 20, i.e., the comparison example, demonstrated a lower value of 240V. Also, while the breakdown voltage values measured in test pieces Nos. 24 to 26 according to the present invention, in which a sulfonic acid type surfactant was added, ranged between 250V and 280V, test piece No. 29, i.e., the comparison example, demonstrated a lower value of 240V, and in the case of the prior art test piece No. 30, in which no surfactant was added, a greatly reduced value of 150V was obtained.

As for the shorting defect rate, while test pieces Nos. 21 to 27, which contained at least one of either a phosphoric ester type surfactant or a sulfonic acid type surfactant demonstrated an extremely low rate of 0%, test piece No. 30 of the prior art, which contained no surfactant showed a very high shorting defect rate of 33.2%.

d. Number of pinholes (quantity/10 m).

In each of test pieces Nos. 21 to 27 according to the present invention, which contained at least one of either a phosphoric ester type surfactant or a sulfonic acid type surfactant, the number of pinholes was 0/10 m. By comparison, in test piece No. 30, which contained no surfactant, 7 pinholes/10 m were observed. As these results clearly indicate, when green sheet formation and electrode printing are performed repeatedly, the use of a ceramic coating containing a surfactant prevents the formation of pinholes.

e. Yield.

While the yield values achieved by test pieces Nos. 21 to 23 according to the present invention, to which a phosphoric ester type surfactant was added, and test piece No. 27, to which both a phosphoric ester type surfactant and a sulfonic acid type surfactant were added, ranged between 96% and 98%, while test piece No. 28, i.e., the comparison example, demonstrated inferior performance at 63%. In addition, whereas test pieces Nos. 24 to 26 according to the present invention, to which a sulfonic acid type surfactant was added, achieved a 98% yield, the yield of test piece No. 29, i.e., the comparison example, was only 53%. This is thought to be attributable to problems caused by excessive quantities of the surfactant in test pieces Nos. 28 and 29, i.e., the comparison examples, manifesting in breakage in the green sheet during the peeling process that takes place during the process of obtaining a laminated body or, the green sheet becoming adhered to the die during the pressing and cutting processes.

Moreover, the yield of test piece No. 30, produced through the manufacturing method of the prior art, was greatly reduced, at 33%.

(Evaluation of characteristics 4: advantages achieved by adding surfactant and performing positional alignment through image processing)

Next, the data in regard to the advantages achieved by performing the positional alignment through image processing, which is a crucial element in the manufacturing method according to the present invention, as well as advantages achieved by using a ceramic coating containing surfactant, are shown in TABLE 6. In the table, test pieces Nos. 31 and 32 are laminated ceramic capacitors produced through the manufacturing processes shown in FIG. 1, test piece No. 33 is a laminated ceramic capacitor produced through the manufacturing processes shown in FIG. 2 and test piece No. 34 is a laminated ceramic capacitor produced through the manufacturing method of the prior art.

In test piece No. 31, the green sheet thickness was 8.0 µm, the thickness of one layer in the dielectric layers 2 after baking was 5 µm and the number of laminated layers was 75. In test piece No. 32, the green sheet thickness was 2.5 µm, the thickness of one layer in the dielectric layers 2 after baking was 1.5 µm and the number of laminated layers was 150. Test pieces Nos. 31 and 32 contained both a phosphoric ester type surfactant and a sulfonic acid type surfactant at a ratio of 1 wt % each.

In test piece No. 33, which used a green sheet prepared through the prior art method with no surfactant added, the green sheet thickness was 8.0 µm, the thickness of one layer in the dielectric layers 2 after baking was 5 µm and the number of laminated layers was 75 with no surfactant added.

In test piece No. 34, the green sheet thickness was 2.5 µm, the thickness of one layer in the dielectric layers 2 after baking was 1.5 µm and the number of laminated layers was 150. No surfactant was added. However, because of the small thickness of the green sheets at 2.5 µm in test piece No. 34, a sufficient number of layers could not be laminated to achieve the required characteristics for a laminated ceramic capacitor (lamination not possible).

On these laminated ceramic capacitors, evaluation tests to determine the number of pinholes (quantity/10 m), the electrostatic capacitance, the dielectric loss, the insulating resistance, the breakdown voltage, the shorting defect rate, the printing misalignment and the yield were performed. TABLE. 6 shows the results of the evaluation made through the tests. For each of test pieces Nos. 31 to 34, the number of samples subjected to testing was 30,000.

TABLE 6

| No. | green sheet thickness (μm) | number of laminated layers | capacitance (μF) | tan δ (%) | insulating resistance (Ω) | breakdown voltage (v) | laminating method | surfactant (wt %) |
|---|---|---|---|---|---|---|---|---|
| 31 | 8.0 | 75 | 1.01 | 1.86 | $1.8 \times 10^9$ | 230 | FIG. 1 | sulfonic acid type 1.0 |
| 32 | 2.5 | 150 | 6.66 | 1.91 | $4.2 \times 10^8$ | 80 | FIG. 1 | phosphoric ester type 1.0 |
| *33 | 8.0 | 75 | 0.91 | 1.88 | $1.7 \times 10^9$ | 150 | prior art | none |
| *34 | 2.5 | 150 | not measured because lamination not possible | | | | prior art | none |

| No. | green sheet thickness (μm) | number of laminated layers | Δ Gmax −av (μm) | yield (%) | shorting defect rate (%) | laminating method | surfactant (wt %) |
|---|---|---|---|---|---|---|---|
| 31 | 8.0 | 75 | 8 | 97 | 0.00 | FIG. 1 | sulfonic acid type 1.0 |
| 32 | 2.5 | 150 | 13 | 97 | 0.08 | FIG. 1 | phosphoric ester type 1.0 |
| *33 | 8.0 | 75 | 250 | 33 | 33.2 | prior art | none |
| *34 | 2.5 | 150 | not measured because lamination not possible | | | | none |

*: comparison example a. Electrostatic capacitance, dielectric loss.

Measurement was made at 20° C. using a Hewlett Packard impedance analyzer HP-4284A. Rile the electrostatic capacitance in test piece No. 33 was 0.91 F, the electrostatic capacitance in test piece No. 31 was 1.01 μF, indicating that test piece No. 31, produced through the manufacturing method according to the present invention, achieved greater electrostatic capacitance compared to test piece No. 33, produced through the manufacturing method of the prior art. In the comparison of test piece No. 32 against test piece No. 34, while lamination was not possible with test piece No. 34 with a green sheet thickness of 2.5 μm, in test piece No. 32, produced through the manufacturing method according to the present invention, an electrostatic capacitance of 6.66 μF was achieved using thin green sheets with a thickness of 2.5 μm.

As for tan δ (%), the measurement for test piece No. 33 was 1.88% while the measurement for test piece No. 31 was 1.86%. Thus, the dielectric loss in test piece No. 31 was reduced compared to that in test piece No. 33.

b. Insulating resistance and shorting defect rate.

10V at 20° C. was applied by a Hewlett Packard high ohm meter HP-4329A and measurement was made after 30 seconds. It was decided that a shorting defect occurred when the insulating resistance was at 1000Ω or less, and for each of the test pieces Nos. 31 to 36, the number of shorting defects against the entire number of samples subjected to testing constituted a ratio which expressed the shorting defect rate.

While the insulating resistance is $1.7 \times 10^9 \Omega$ in test piece No. 33, in test piece No. 31 it was $1.8 \times 10^9 \Omega$. In addition, test piece No. 32 also exhibits a large insulating resistance of $4.2 \times 10^8 \Omega$.

While the shorting defect rate in test piece No. 33 was 33.2%, in test pieces Nos. 31 and 32 according to the present invention, it was 0 to 0. 8%, showing a great improvement.

c. Breakdown voltage.

In order to evaluate the breakdown voltage, measurement was made by an automatic booster testing device. While the breakdown voltage in test piece No. 33 was 150V, the breakdown voltage in test piece No. 31 was 230V, indicating that test piece No. 31, produced through the manufacturing method according to the present invention, achieved a larger breakdown voltage compared to test piece No. 33, produced through the manufacturing method of the prior art. Even test piece No. 32, with an extremely small green sheet thickness of 2.5 μm (thickness after drying 1.5 μm), achieved a breakdown voltage of 80V.

d. Printing misalignment.

While the average value ΔGmax-av for test piece No. 33 was 250 μm, the corresponding values in test pieces Nos. 31 and 32 were 8 μm and 13 μm respectively, indicating that the printing misalignment was greatly reduced in test pieces Nos. 31 and 32 produced through the manufacturing method according to the present invention, compared to test piece No. 33 produced through the manufacturing method of the prior art.

e. Yield.

While the yield for test piece No. 33 was 33%, test pieces Nos. 31 and 32 both achieved a yield of 97%. In the manufacturing method according to the present invention, the yield is greatly improved.

(Evaluation of characteristics 5: advantages achieved mainly by not having rollers in contact with the application surface)

TABLE 7 shows the results of characteristics evaluation made on laminated ceramic capacitors produced using the applicator device according to the present invention and on laminated ceramic capacitors produced using an applicator device of the prior art. In TABLE 7, test pieces Nos. 41 and 42 are laminated ceramic capacitors produced employing an applicator device of the prior art, and test pieces Nos. 43 and 44 are laminated ceramic capacitors produced using the applicator device according to the present invention. In test pieces Nos. 41 and 42, the rollers come in contact with the green sheet during its formation while in test pieces Nos. 43 and 44, the rollers do not come in contact with the green sheet during its formation In test piece No. 41, the green sheet thickness was at 11.0 μm while the thickness of one layer in the dielectric layers 2 after baking was 6.6 μm with the number of laminated layers at 110. In test piece No. 42, the green sheet thickness is at 16.0 μm while the thickness of one layer in the dielectric layers 2 after baking was 9.6 μm with the number of laminated layers at 75. In test piece No. 43, the green sheet thickness was at 11.0 μm while the thickness of one layer in the dielectric layers 2 after baking is 6.6 μm with the number of laminated layers at 110. In test piece No. 44, the green sheet thickness was at 16.0 μm while the thickness of one layer in the dielectric layers 2 after baking is 9.6 μm with the number of laminated layers at 75.

On these laminated ceramic capacitors, evaluation tests to determine the number of pinholes (quantity/10 m) the electrostatic capacitance, the dielectric loss, the insulating resistance the breakdown voltage and the shorting defect rate, were performed. TABLE 7 shows the results of the evaluation made through the tests. For each of test pieces Nos. 41 to 44, the number of samples subjected to testing was 30,000.

TABLE 7

| No. | green sheet thickness (μm) | number of laminated layers | peeling pinholes (quantity/10 m) | capacitance (μF) | tan δ (%) | rollers |
|---|---|---|---|---|---|---|
| *41 | 11.0 | 110 | 33 | 0.96 | 1.72 | contact |
| *42 | 16.0 | 75 | 49 | 0.50 | 1.63 | contact |
| 43 | 11.0 | 110 | 0 | 1.04 | 1.70 | non contact |
| 44 | 16.0 | 75 | 0 | 0.50 | 1.60 | non contact |

| No. | green sheet thickness (μm) | number of laminated layers | insulating resistance (Ω) | breakdown voltage (v) | shorting defect rate (%) | rollers |
|---|---|---|---|---|---|---|
| *41 | 11.0 | 110 | $2.3 \times 10^9$ | 350 | 10.4 | contact |
| *42 | 16.0 | 75 | $4.3 \times 10^9$ | 610 | 6.5 | contact |
| 43 | 11.0 | 110 | $3.0 \times 10^9$ | 580 | 0.4 | non contact |
| 44 | 16.0 | 75 | $4.9 \times 10^9$ | 800 | 0.2 | non contact |

*: comparison example a. Number of pinholes (quantity/10 m).

In each of test pieces Nos. 43 and 44 produced using an applicator device according to the present invention, the number of pinholes was 0/10 m. In contrast, in test piece No. 41, produced using an applicator device of the prior art, 33 pinholes/10 m were observed, while in test piece No. 42, 49 pinholes/10 m were observed. This is thought to be attributable to the fact that in the manufacturing method that employs the applicator device according to the present invention, the surface of the flexible supporting body on to which the ceramic coating is applied, does not come in contact with the rollers either before or after the application and, thus, no pinholes are formed because of the green sheets becoming sloughed off. On the other hand, in the manufacturing method that employs the applicator device of the prior art, the surface of the flexible supporting body on to which the ceramic coating is applied, comes in contact with the rollers before and after the application, which frequently results in pinholes caused by the green sheets being sloughed off.

b. Electrostatic capacitance, dielectric loss.

Measurement was made using a Hewlett Packard impedance analyzer HP-4284A at 20° C. While the electrostatic capacitance in test piece No. 41 was 0.96 μF, the electrostatic capacitance in No. 43 was 1.04 μF, indicating that test piece No. 43 produced using the applicator device according to the present invention achieved greater electrostatic capacitance compared to test piece No. 41 produced using the applicator device of the prior art. The same level of electrostatic capacitance was achieved in test pieces Nos. 42 and 44. The advantages of an applicator device according to the present invention are realized most effectively when the thickness of green sheets is small.

As for tan δ (%), the measurements for test pieces Nos. 41 and 42 were 1.72% and 1.63% respectively, while those for test pieces Nos. 43 and 44 were 1.70% and 1.60% respectively.

c. Insulating resistance and shorting defect rate.

10V was applied by the Hewlett Packard high ohm meter HP-4329A at 20° C. and measurement was made 30 seconds later. It was decided that a shorting defect occurred when the insulating resistance was at 1000Ω or less, and for each of the test pieces Nos. 41 to 44, the rate of the number of shorting defects against the entire number of samples subjected to testing was expressed as the shorting defect rate.

While the insulating resistance values in test pieces Nos. 41 and 42 were $2.3 \times 10^9 \Omega$ and $4.3 \times 10^9 \Omega$ respectively, those in test pieces Nos. 43 and 44 were $3.0 \times 10^9 \Omega$ and $4.9 \times 10^9 \Omega$ respectively indicating that test pieces Nos. 43 and 44 produced using an applicator device according to the present invention achieved a larger insulating resistance compared to test piece Nos. 41 and 42 produced using an applicator device of the prior art. The reason for this is attributed to the fact that the green sheet does not become damaged due to contact with the rollers since the rollers do not come in contact with the green sheet at all.

While the shorting defect rates in test pieces Nos. 41 and 42 were 10.4%, and 6.5% respectively, those in test pieces Nos. 43 and 44 were 0.4% and 0.2% respectively, with a great reduction in the shorting defect rate achieved in test pieces Nos. 43 and 44 produced using an applicator device according to the present invention compared with the test pieces Nos. 41 and 42 produced using an applicator device of the prior art.

d. Breakdown voltage.

In order to evaluate the breakdown voltage, measurement was made by an automatic booster testing device. While the breakdown voltages in test pieces Nos. 41 and 42 were 350V, and 610V respectively, the breakdown voltage in test pieces Nos. 43 and 44 were 580V, and 800V respectively, indicating that test pieces Nos. 43 and 44 produced through the manufacturing method according to the present invention, achieve larger breakdown voltage compared to test pieces Nos. 41 and 42 produced through the manufacturing method of the prior art. The reason for this is attributed to the fact that the green sheet does not become damaged due to contact with the rollers since the rollers do not come in contact with the green sheet at all.

(Evaluation of characteristics 6: advantages achieve mainly by tension control)

When producing laminated ceramic green sheets with an applicator device according to the present invention, if the take-up tension is excessive, as the laminated ceramic green sheets become thicker, the green sheet which corresponds to the last take-up operation, may be transferred to the surface of the flexible supporting body which is opposite from the application surface, since the application surface of the flexible supporting body is given a surface treatment with Si or the like, to accommodate peeling. TABLE 8 shows varying degrees of transfer for different degrees of tension when 8 μm ceramic green sheets were laminated in 75 layers.

TABLE 8

| No. | take - up tension (kgf/100 mm width) | transfer frequency over delivery length of 1000 m | |
|---|---|---|---|
| | | (number/100 mm width) | (number/1000 mm width) |
| *55 | 0.05 | not possible due to take - up misalignment | |
| 56 | 0.1 | 0 | 0 |
| 57 | 0.5 | 0 | 0 |
| 58 | 1.0 | 0 | 0 |
| 59 | 1.5 | 0 | 0 |
| *60 | 2.0 | 18 | 31 |

*: comparison example

In test piece No. 55, take-up misalignment was observed due to excessively low take-up tension. In test piece No. 60, on the other hand, transfer occurred at 18 locations (100 mm width) or 31 locations (1000 mm width) due to excessively high take-up tension. Transfer did not occur at all in test pieces Nos. 56 to 59. These results indicate that the optimal take-up tension is in the range of 0.1 kgf to 1.5 kgf/100 mm width.

(Evaluation of characteristics 7: Peeling treatment on flexible supporting body)

TABLE 9 shows the results of characteristics evaluation of related to the peeling treatment on the flexible supporting body 19. In TABLE 9, "peeling treatment over entire width" refers to peeling treatment given over the entire ceramic coating application surface of the flexible supporting body while "peeling treatment over restricted width" refers to peeling treatment given as shown in FIGS. 9 to 11, in which the ceramic coating application surface of the flexible supporting body has areas 190 that are given peeling treatment and areas 191 that are not peeling treated.

TABLE 9

| peeling treatment on supporting body | peeling frequency (75 repetition × 1000 m) | adhesion on to engraving during printing (1000 m) |
|---|---|---|
| peeling treatment over entire width | 5 | 53 |
| peeling treatment over restricted width | 0 | 0 |

As shown in TABLE 9, during a run with 75 repetitions (1000 m each time), there were 5 incidents of peeling in the case of peeling treatment over the entire width, while no peeling occurred in the case of peeling treatment over a restricted width. These results are attributed to the fact that while, if the peeling film 190 is provided over the entire surface of the flexible supporting body 19, which is the case in the peeling treatment over the entire width, the edges of the green sheet may become sloughed off from the flexible supporting body 19 during printing to become adhered to the engraving or the entire green sheet may separate from the flexible supporting body 19 due to the means for ceramic coating application such as the nozzle, the doctor blade or the like coming into contact even slightly with the green sheet, if the peeling film 190 is formed in such a manner that there are areas 191 that are not treated for peeling, which is the case in peeling treatment over a restricted width, in the flexible supporting body 19, the adhesion of the edges of the green sheet to the flexible supporting body 19 improves.

(Evaluation of characteristics 8: advantages of coloring)

Laminated ceramic capacitors were produced through the manufacturing method illustrated in FIG. 2. The colored areas 192 on the flexible supporting body 19 were colored yellow and then over the colored areas 192, the black first target marks (a1) to (d1) were stamped, in FIGS. 15 to 19. The green sheet formation process and the printing process employing image processing were repeated 5 times. The resulting laminated green sheets over 5 layers were then peeled off the flexible supporting body 19 and by reading the second target marks, which were printed on the green sheet along with the electrode pattern, image processing was performed until the green sheets, each of which were set to have 5 layers, were laminated to a total of 75 layers. The thickness of the green sheets were 8 μm. Then, processes such as pressing, cutting, de-binding, baking and terminal electrode formation are executed to obtain laminated capacitors.

For purposes of comparison, laminated ceramic capacitors were produced through the prior art technology, which does not employ image processing.

TABLE 10 shows characteristics of the samples obtained through the manufacturing method according to the present invention, and those of the samples obtained through the prior art method.

TABLE 10

| | capacitance (μF) | tan δ (%) | yield (%) |
|---|---|---|---|
| present invention method | 1.03 | 1.85 | 92 |
| prior art method | 0.91 | 1.88 | 33 |

As TABLE 10 clearly indicates, the samples obtained through the manufacturing method according to the present invention, demonstrate superior characteristics in the electrostatic capacitance, tan δ and yield to those of the samples obtained through the manufacturing method of the prior art.

Next, TABLE 11 gives the number of image processing errors in the samples (colored) obtained through the manufacturing method according to the present invention, and in the samples obtained through the manufacturing method described above by stamping black first target marks (a1) to (d1) on a transparent flexible supporting body that is not provided with a colored area.

TABLE 11

| | not colored | colored |
|---|---|---|
| number of image processing errors | 41/1000 | 0/1000 |

As TABLE 11 clearly indicates, in colored samples according to the present invention, the number of image processing errors was greatly reduced compared to that in samples that are not colored. This is thought to be attributable to the fact that while, if the flexible supporting body is transparent and not colored, errors tend to occur during image processing due to the color of the back surface of the flexible supporting body being picked up by the camera, if the flexible supporting body is colored, such a problem is eliminated.

(Evaluation of characteristics 9: hot air drying)
a. Evaluation of the drying method.

The dryers shown in FIGS. 32 and 33 were each combined with the hot air generating device shown in FIG. 34. In the combination of the dryer in FIG. 32 and the hot air generating device shown in FIG. 34, a hot air generator 355 provided with two 3 kW heaters was employed. In the combination of the dryer in FIG. 33 and the hot air generating device shown in FIG. 34, a 5 kW far infrared light heater 353 and a 3 kW hot air generator 353 were employed in combination. In both cases, the air flow rate at the hot air generator 355 is set at 2.3 Nm³/minute. For the sake of comparison, a dryer, which employs only a 10 kW far infrared light heater without a hot air generating device was prepared.

The electrode drying process was executed using the three types of means for drying described above. The results of electrode drying thus obtained are shown in TABLE 12. The quantity of deformation (μm) of the flexible supporting body is the quantity of deformation per 100 mm of the flexible supporting body length.

TABLE 12

| drying method | temperature (°C.) | quantity of supporting body deformation (μm) | drying time (sec) |
| --- | --- | --- | --- |
| hot air | 40 | 3 | 360 |
| hot air | 45 | 3 | 200 |
| hot air | 55 | 5 | 120 |
| hot air | 80 | 25 | 80 |
| hot air | 85 | 45 | 65 |
| hot air and far infrared light | 55 | 5 | 100 |
| far infrared light | 45 | 6 | 600 |
| far infrared light | 80 | 35 | 300 |
| far infrared light | 90 | 105 | 180 |

Since advantages such as an improvement in production efficiency, reduction in equipment costs and the like cannot be achieved with long drying times, even if the quantity of deformation is kept low, it is reasonable to set the criteria for acceptable performance at 30 μm or less for the quantity of supporting body deformation and at 240 seconds or less for the drying time. Evaluated in conformance to these evaluation criteria, in the prior art dryer employing a far infrared light heater, the drying time lengthens to 180 to 600 seconds and the quantity of deformation reaches a maximum of 105 μm. Thus its performance is far from satisfying the criteria of acceptable performance described above. While it is possible to keep the quantity of deformation at 6 μm in the prior art dryer, the required drying time in this case will be very long, at 600 seconds.

In contrast, with the two drying methods applied in the dryer according to the present invention, i.e., the hot air drying method and the method using far infrared light drying and hot air drying together, the criteria of acceptability are satisfied in most cases. In particular, within the temperature range of 45° to 80° C., the quantity of deformation is 3 to 25 μm and the drying time is 80 to 200 seconds, showing a great improvement. The reason that the quantity of deformation increases at temperatures around 80, is thought to be the fact that 80° C. is above the glass transition point for polyethylene terephlalate. It is also thought that the quantity of deformation is reduced in the hot air drying method because, generally speaking, the quantity of heat applied to the organic flexible supporting body varies between a hot air and a far infrared light heater.

b. Evaluation of characteristics of laminated ceramic capacitors resulting from hot air drying.

TABLE 13 shows the results of evaluation of the characteristics of laminated ceramic capacitors obtained through the manufacturing method mentioned above. In TABLE 13, test pieces Nos. 71 to 73 are test pieces obtained by performing drying with the combination of the dryer 35 in FIG. 32 and the hot air generating device in FIG. 34. Test pieces Nos. 74 and 75 are comparison examples and were prepared by performing drying without employing a hot air generating device but with a prior art dryer that employed a 10 kW far infrared light heater. Test piece No. 76 was obtained by employing the dryer in FIG. 33 and the hot air generating device in FIG. 34, with a combination of a 5 kW far infrared light heater 353 and a 3 kW hot air generator 353. In all cases, the air flow rate at the hot air generator 353 was set at 2.3 Nm³/minute.

Each of test pieces Nos. 71 to 76 had 75 laminated layers. The thickness of each ceramic layer was 8.0 μm before baking and 5 μm after baking.

Tests were performed on these laminated ceramic capacitors to evaluate their electrostatic capacitance, dielectric loss, printing misalignment and yield. TABLE 13 shows the results of this evaluation.

TABLE 13

| No. | drying method | temperature (°C.) | capacitance (μF) | capacitance inconsistency (%) | tan δ (%) | Δ Gmax −av (μm) | yield (%) |
| --- | --- | --- | --- | --- | --- | --- | --- |
| 71 | hot air | 45 | 1.06 | 4.5 | 1.86 | 8 | 92 |
| 72 | hot air | 55 | 1.05 | 5.1 | 1.86 | 10 | 93 |
| 73 | hot air | 80 | 0.99 | 8.6 | 1.85 | 18 | 89 |
| 74 | far infrared light | 90 | 0.92 | 35.6 | 1.86 | 108 | 77 |
| 75 | far infrared light | 80 | 0.95 | 12.3 | 1.86 | 33 | 83 |
| 76 | hot air and far infrared light | 55 | 1.03 | 4.8 | 1.87 | 9 | 91 | a. Electrostatic capacitance.

Measurement was made at 20° C. employing the Hewlett Packard impedance analyzer HP-4284A.

b. Inconsistency in electrostatic capacitance.

Inconsistency in electrostatic capacitance refers to the value that is obtained by first multiplying the standard deviation σ by three and then dividing the resulting value by the average electrostatic capacitance value, and this is given as a percentage in TABLE 13. The larger the electrostatic capacitance inconsistency value, the larger the deviation of electrostatic capacitance within a given product.

TABLE 13 shows that in test pieces Nos. 74 and 75, obtained by employing the prior art dryer, the electrostatic capacitance inconsistency reached 12.3 to 35.6%, signifying that the deviation of electrostatic capacitance in the product was very high.

In contrast, in test pieces Nos. 71 to 73 and 75, prepared using the dryer according to the present invention, the maximum electrostatic capacitance inconsistency was 8.6% with a minimum inconsistency at 4.5%, demonstrating a great improvement over the prior art.

c. Printing misalignment.

While the average value ΔGmax-av in test pieces Nos. 74 and 75 obtained by employing the prior art dryer was 33 to 108 μm, the average value ΔGmax-av in test pieces Nos. 71 to 73 and 76 prepared by employing the dryer according to the present invention, was in the range of 8 to 18 μm. This clearly demonstrates that in test pieces Nos. 71 to 73 and 76 obtained with the device according to the present invention, the printing misalignment was greatly reduced compared to test pieces Nos. 74 and 75 obtained using the device of the prior art.

d. Yield.

While the yield with test pieces Nos. 74 and 75 were 77% and 83% respectively, the corresponding values in test pieces Nos. 71 to 73 and 76 were in the range of 89 to 93%, achieving a higher yield.

While the invention has been particularly shown and described with reference to preferred embodiments thereof, it will be understood by those skilled in the art that various changes in form and detail may be made therein without departing from the spirit, scope and teaching of the invention.

What is claimed is:

1. A method for manufacturing ceramic electronic components comprising the steps of;

forming an unbaked ceramic layer on a surface of an organic flexible supporting body by applying a ceramic paste, said surface having an area that is given a peeling treatment and areas that are not given said peeling treatment;

forming first target marks on said flexible supporting body; and positioning and printing electrodes on said unbaked ceramic layer, based upon information obtained through image processing of said first target marks.

2. A method for manufacturing ceramic electronic components according to claim 1 wherein;

said ceramic paste contains as its main constituent, ceramic particles of at least one type selected from a group of materials including: dielectric ceramic material, piezoelectric ceramic material, and non-linear voltage ceramic material.

3. A method for manufacturing ceramic electronic components according to claim 1 wherein;

said ceramic paste contains ceramic particles at a ratio of 5 vol % to 20 vol %.

4. A method for manufacturing ceramic electronic components according to claim 1 wherein;

said ceramic paste contains ceramic particles and at least one type of surfactant selected from a phosphoric ester type surfactant or a sulfonic acid type surfactant, at a ratio of 0.05 wt % to 5 wt % relative to said ceramic particles.

5. A method for manufacturing ceramic electronic components according to claim 1 wherein;

said unbaked ceramic layer formation process and said printing process are repeated on said flexible supporting body.

6. A method for manufacturing ceramic electronic components according to claim 1 further comprising;

a process which follows a plurality of repetitions of said green sheet formation process and said printing process, in which a laminated green sheet obtained thereby is peeled from said flexible supporting body and then a plurality of laminated green sheets thus obtained by peeling are laminated together.

7. A method for manufacturing ceramic electronic components according to claim 6 wherein;

said printing process includes a procedure in which second target marks are printed on said green sheet, and lamination of said laminated green sheets is performed based upon information obtained through image processing of said second target marks.

8. A method for manufacturing ceramic electronic components according to claim 7 wherein;

corrected printing positions for electrodes are determined based upon the positional relationships that said second target marks have to said first target marks.

9. A method for manufacturing ceramic electronic components according to claim 1 wherein;

said areas that are not given said peeling treatment are provided on both sides of said flexible supporting body in the direction of the width.

10. A method for manufacturing ceramic electronic components according to claim 1 wherein;

said flexible supporting body is provided with areas that are given said peeling treatment on the outside of said areas that are not given said peeling treatment.

11. A method for manufacturing ceramic electronic components according to claim 1, wherein;

said flexible supporting body is provided with a colored area on at leat one surface, and said first target marks are formed in a different color from the color of said colored area within said colored area on said flexible supporting body.

12. A method for manufacturing ceramic electronic components according to claim 11, wherein;

said peeling treatment is not performed on the surface of said colored area and said first target marks are printed on said colored area.

13. A method for manufacturing ceramic electronic components according to claim 1, wherein;

said flexible supporting body is provided with a colored area on at least one surface, and said first target marks are formed in a different color from the color of said colored area, and are formed in an area overlapping said color area on said flexible supporting body.

14. A method for manufacturing ceramic electronic components according to claim 11 or 13 wherein;

said color of said colored area is a yellow, a pink, a light green or a white, and said first target marks are in a black.

15. A method for manufacturing ceramic electronic components according to claim 1 wherein;

said first target mark formation process is included in said printing process.

16. An apparatus for manufacturing ceramic electronic components, comprising:

an applicator head and a plurality of rollers for forming an unbaked ceramic layer on an organic flexible supporting body by applying a ceramic paste;

means for forming first target marks on said flexible supporting body; and means for positioning and printing electrodes on said unbaked ceramic layer, based upon information obtained through image processing of said first target marks; wherein;

said applicator head is an extrusion type head provided with a plurality of nozzles and applies ceramic paste on one surface of said flexible supporting body, which runs in one direction, and each of said rollers is positioned to come in contact with only the surface of the flexible supporting body that is opposite the surface of said flexible supporting body upon which said ceramic paste is applied.

17. An apparatus for manufacturing ceramic electronic components comprising;

means for forming an unbaked ceramic layer on an organic flexible supporting body by applying a ceramic paste, means for forming first target marks on said flexible supporting body, and means for positioning and printing electrodes on said unbaked ceramic layer, based upon information obtained through image processing of said first target marks, wherein;

said means for printing comprises:

a printing table having a printing receptacle surface constituting a vacuum holding surface for recieving said flexible supporting body, and a table drive device which drives said printing table in the X-direction and the Y-direction, which two directions constitute two hypothetical orthogonal axes X and Y along said printing receptacle surface and in a Θ-direction, which direction rotates around an axis that run orthogonally to said two axes.

18. An apparatus for manufacturing ceramic electronic components according to claim 17 further comprising;

means for supply, and means for take-up, wherein;

said means for supply holds an organic flexible supporting body that is provided with an unbaked ceramic layer on one surface thereof, said means for printing prints electrodes on said unbaked ceramic layer on said flexible supporting body supplied from said means for supply, and said means for take-up takes up said flexible supporting body supplied from said means for supply via said means for printing.

19. An apparatus for manufacturing ceramic electronic components according to claim 17, wherein;

said means for printing is provided with a means for image processing that includes a plurality of cameras with light-receiving portions for said cameras provided at said printing table.

20. An apparatus for manufacturing ceramic electronic components according to claim 19, wherein;

said means for image processing is provided with optical paths extending from said light receiving portions for said cameras to said cameras, and said optical paths include a reflective mirror for directing light from said light-receiving portions into said cameras.

21. An apparatus for manufacturing ceramic electronic components according to claim 17, further comprising;

a fixed-length feed device that performs feed over a fixed length by vacuum holding said flexible supporting body after said flexible supporting body is processed through said means for printing.

22. An apparatus for manufacturing ceramic electronic components according to claim 17, wherein;

said means for printing prints second target marks on said unbaked ceramic layer.

23. An apparatus for manufacturing ceramic electronic components according to claim 17, wherein;

said means for forming an unbaked ceramic layer is provided with rollers for guiding said flexible supporting body, which do not come in contact with the surface of said flexible supporting body on which said unbaked ceramic layer is formed.

24. An apparatus for manufacturing ceramic electronic components according to claim 17, wherein;

said means for forming an unbaked ceramic layer comprises an applicator head and a plurality of rollers, said applicator head applies ceramic paste on one surface of said flexible supporting body, which runs in one direction, and each of said rollers is positioned to come in contact with only the surface that is opposite the surface of said flexible supporting body upon which said ceramic paste is applied.

25. An apparatus for manufacturing ceramic electronic components according to claim 24, wherein;

said applicator head is an extrusion type head.

26. An apparatus for manufacturing ceramic electronic components according to claim 25, further comprising;

a quantitative decision pump and a mass flowmeter, wherein;

the quantity of coating material supplied to said applicator head is controlled with said quantitative decision pump and said mass flowmeter.

27. An apparatus for manufacturing ceramic electronic components according to claim 17, wherein;

said flexible supporting body is at a tension of 0.1 to 1.5 kgf/100 mm width.

28. An apparatus for manufacturing ceramic electronic components according to claim 17, further comprising;

a dryer for drying undried electrodes supported on said flexible supporting body.

29. An apparatus for manufacturing ceramic electronic components according to claim 28, wherein;

said undried electrodes contain a solvent with a high boiling point.

30. An apparatus for manufacturing ceramic electronic components according to claim 29, wherein;

said dryer, provided with a drying chamber through which said flexible supporting body is fed, supplies hot air to said drying chamber to dry said undried electrodes.

31. A apparatus for manufacturing ceramic electronic components according to claim 30, wherein;

the temperature of said hot air in said drying chamber is set within the range of 45° to 80° C.

32. An apparatus for manufacturing ceramic electronic components according to claim 31, wherein;

said dryer is provided with a far infrared light heater in said drying chamber.

* * * * *